United States Patent
Lee et al.

(10) Patent No.: US 8,487,533 B2
(45) Date of Patent: Jul. 16, 2013

(54) DISPLAY APPARATUS HAVING A RIGID ENCAPSULATION UNIT

(75) Inventors: Choong-Ho Lee, Yongin (KR); Jung-Min Lee, Yongin (KR); Kie-Hyun Nam, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 200 days.

(21) Appl. No.: 13/004,527

(22) Filed: Jan. 11, 2011

(65) Prior Publication Data

US 2011/0289809 A1 Dec. 1, 2011

(30) Foreign Application Priority Data

Jun. 1, 2010 (KR) ........................ 10-2010-0051974

(51) Int. Cl.
*H01L 51/5246* (2006.01)
*H01L 51/524* (2006.01)

(52) U.S. Cl.
USPC ............. 313/512; 313/504; 313/507; 257/40

(58) Field of Classification Search
CPC ........ H01L 51/524; H01L 51/525; G02B 6/24; G02B 6/3383
USPC .................................................. 313/498–512
See application file for complete search history.

(56) References Cited

U.S. PATENT DOCUMENTS

| 6,894,316 | B2 | 5/2005 | Yoshii et al. | |
|---|---|---|---|---|
| 6,998,776 | B2 | 2/2006 | Aitken et al. | |
| 7,132,154 | B2 | 11/2006 | Shibahara et al. | |
| 7,537,504 | B2 | 5/2009 | Becken et al. | |
| 2003/0227024 | A1 | 12/2003 | Yoshii et al. | |
| 2004/0132867 | A1 | 7/2004 | Shibahara et al. | |
| 2007/0092709 | A1 | 4/2007 | Okamoto et al. | |
| 2008/0238302 | A1 | 10/2008 | Sung et al. | |
| 2010/0013372 | A1* | 1/2010 | Oikawa et al. | 313/498 |
| 2011/0248907 | A1* | 10/2011 | Lee et al. | 345/76 |
| 2012/0097987 | A1* | 4/2012 | Ryu et al. | 257/88 |
| 2012/0104420 | A1* | 5/2012 | Lee et al. | 257/88 |

FOREIGN PATENT DOCUMENTS

| KR | 10-2003-0044665 | 6/2003 |
|---|---|---|
| KR | 10-2003-0095261 | 12/2003 |
| KR | 20040077879 | 9/2004 |
| KR | 10-2007-0045095 | 5/2007 |
| KR | 10-2007-0121974 | 12/2007 |
| KR | 10-2008-0045824 | 5/2008 |
| KR | 20080088031 | 10/2008 |
| KR | 10-0912851 | 8/2009 |

OTHER PUBLICATIONS

Park, Korean Patent Application Publication 10-200300044665, Jun. 2003, machine translation.*

* cited by examiner

*Primary Examiner* — Tracie Y Green
(74) *Attorney, Agent, or Firm* — Robert E. Bushnell, Esq

(57) ABSTRACT

A display apparatus including: a display unit disposed on a substrate; an encapsulation unit facing the display unit, the encapsulation unit including: a metal layer; a complex member; and a reinforcement member formed on an upper surface of the complex member; and a sealing unit disposed between the substrate and the encapsulation unit and apart from the display unit to bond the substrate and the encapsulation unit to the sealing unit.

34 Claims, 20 Drawing Sheets

DISPLAY APPARATUS HAVING A RIGID ENCAPSULATION UNIT

CROSS-REFERENCE TO RELATED APPLICATION

This application claims the benefit of Korean Patent Application No. 10-2010-0051974, filed Jun. 1, 2010, in the Korean Intellectual Property Office, the disclosure of which is incorporated herein by reference.

BACKGROUND

1. Field

Aspects of the present invention relate to display apparatuses, and more particularly, to display apparatuses including an encapsulation unit having improved rigidity.

2. Description of the Related Art

Recently, display apparatuses are being replaced with portable, thin flat display apparatuses. In particular, flat display apparatuses, such as organic light emitting display apparatuses and liquid crystal display apparatuses, have a high image quality and thus are gaining attention. A flat display apparatus includes a display unit on a lower substrate and an encapsulation substrate disposed on the display unit to protect the display unit. Also, the sealing unit is disposed between the lower substrate and the encapsulation substrate.

However, the flat display apparatus is easily deformed or damaged by heat. To prevent this damage, a thick lower substrate or a thick encapsulation substrate may be formed. However, in this case, if an external force due to thermal residual stress of the sealing unit is applied to the flat display apparatus, a rigidity of the display apparatus may be greatly weakened and disbanding may occur along the sealing unit due to a peel stress.

SUMMARY OF THE INVENTION

Aspects of the present invention provide display apparatuses including an encapsulation unit having an improved structure for increasing the rigidity of the encapsulation unit by using a reinforcement member.

According to an aspect of the present invention, there is provided a display apparatus including a display unit disposed on a substrate; an encapsulation facing the display unit including: a metal layer; and a complex member, including a base unit and a convex portion that protrudes upward from the base unit; and a sealing unit disposed between the substrate and the encapsulation unit and apart from the display unit, the sealing unit bonding the substrate and the encapsulation unit to the sealing unit.

According to another aspect of the present invention the convex portion may extend from the base unit in a direction away from the substrate and wherein the convex portion has a shape of a square plate.

According to another aspect of the present invention the convex portion may have a shape of a square ring.

According to another aspect of the present invention the convex portion may comprise: a first convex portion extending from the base unit in a direction away from the substrate and having a shape of a square plate; and a second convex portion having a shape of an oval ring, an X-shape, or a stripe shape, and protruding upward from the first convex portion.

According to another aspect of the present invention the convex portion may further comprise a protrusion protruding from an upper surface.

According to another aspect of the present invention the convex portion may further comprise an extension portion extending from an edge of the encapsulation unit and surrounding an edge of the substrate.

According to another aspect of the present invention the complex member may include a resin matrix and carbon fibers. The metal layer is disposed nearer to the substrate than the complex member is.

According to another aspect of the present invention, there is provided a display apparatus including: a display unit disposed on a substrate; an encapsulation unit facing the display unit, the encapsulation unit including: a metal layer; a complex member; and at least one rib formed on an upper surface of the complex member; and a sealing unit disposed between the substrate and the encapsulation unit and apart from the display unit to bond the substrate and the encapsulation unit to the sealing unit.

According to another aspect of the present invention the rib may extend in a lengthwise direction of the complex member.

According to another aspect of the present invention the complex member may include a protrusion protruding from an upper surface.

According to another aspect of the present invention the complex member may include an extension portion extending from an edge of the encapsulation unit to surround an edge of the substrate.

According to another aspect of the present invention the complex member may include: a resin matrix; and carbon fibers, wherein the metal layer is disposed nearer to the substrate than the complex member is.

According to another aspect of the present invention, there is provided a display apparatus including: a display unit disposed on a substrate; an encapsulation unit facing the display unit, the encapsulation unit comprising: a metal layer; a complex member; and a reinforcement member formed on an upper surface of the complex member; and a sealing unit disposed apart from the display unit between the substrate and the encapsulation unit to bond the substrate and the encapsulation unit to the sealing unit.

According to another aspect of the present invention the reinforcement member may be a convex portion protruding upwards from a base unit of the complex member, and wherein the reinforcement member is formed as a single unit with the complex member.

According to another aspect of the present invention the reinforcement member may be at least one rib that is formed on an upper surface of the complex member.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
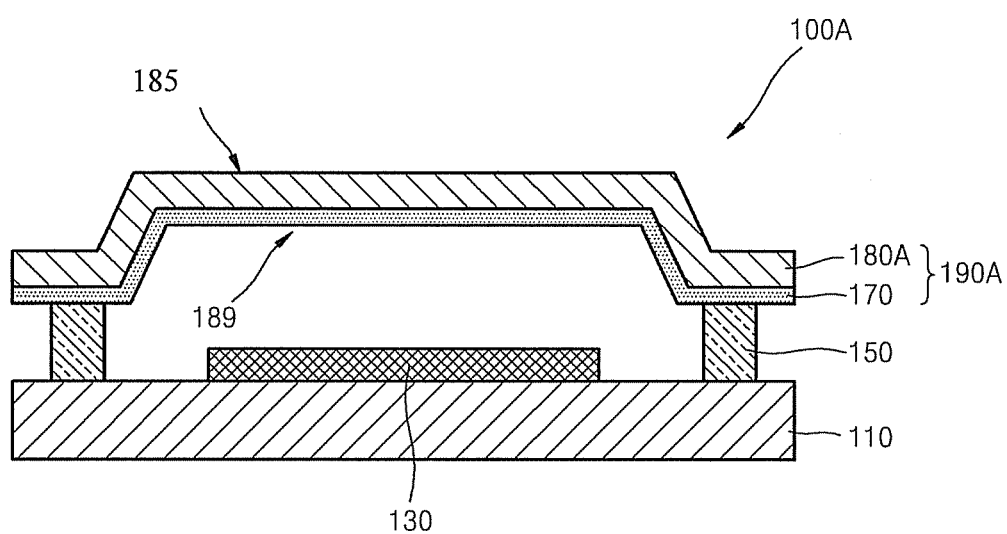
FIG. 1 is a cross-sectional view of a display apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
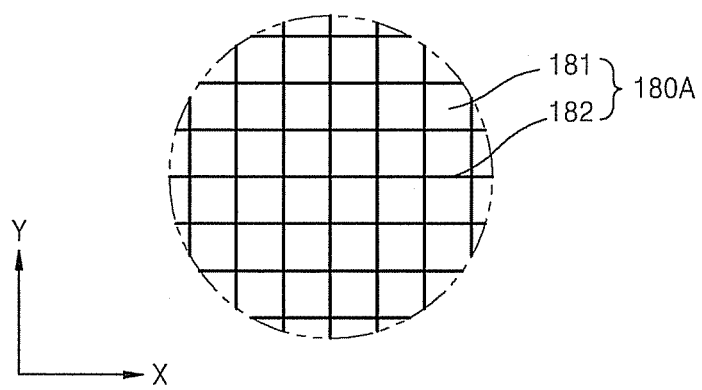
FIGS. 2 and 3 are schematic views illustrating a complex member illustrated in FIG. 1.
Figure 3:
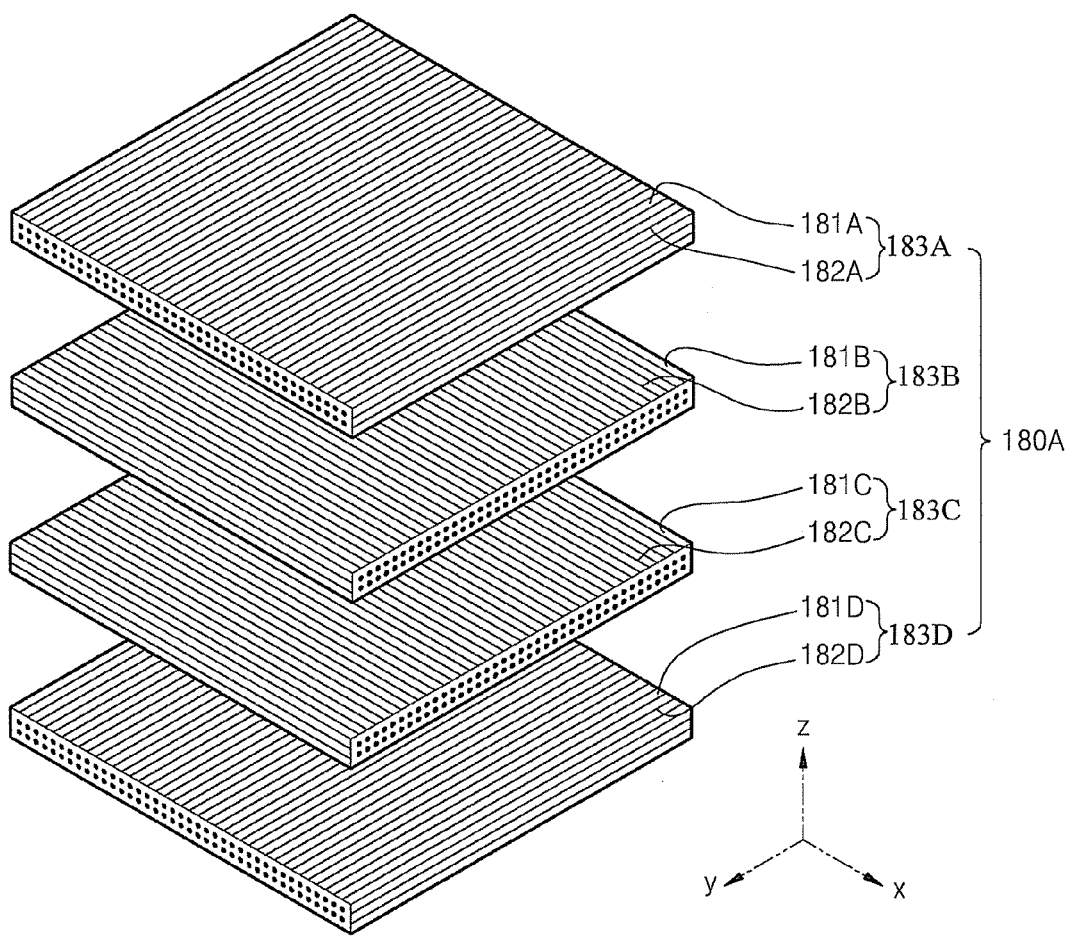

FIG. 1 is a cross-sectional view of a display apparatus 100A, according to an embodiment of the present invention. FIGS. 2 and 3 are schematic views illustrating a complex member 180A illustrated in FIG. 1. Referring to FIG. 1, the display apparatus 100A includes a substrate 110, a display unit 130, an encapsulation unit 190A, and a sealing unit 150.

The substrate 110 is formed of a transparent glass having $SiO_2$ as a main component. However, aspects of the present invention are not limited thereto and may also be formed of other transparent plastic materials. Examples of the plastic material of the substrate 110 include polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), cellulose acetate propionate (CAP), and other similar materials.

A plurality of processes are performed to form the display unit 130 on the substrate 110, and heat is applied during these processes, which causes the substrate 110 to expand. The expansion of the substrate 110 reduces durability of the display apparatus 100A and precision of the display unit 130. Accordingly, the substrate 110 has a low thermal expansion rate, for example, $3*10^{-6}$/K to $4*10^{-6}$/K. The display unit 130 comprises an organic light emitting device, a liquid crystal display apparatus, etc., and is disposed on the substrate 110.

The encapsulation unit 190A is disposed so as to face the display unit 130. The encapsulation unit 190A protects the display unit 130 from water or oxygen, or other similar impurities or elements, from the outside. The encapsulation unit 190A includes a metal layer 170 and a complex member 180A. The complex member 180A is formed on the metal layer 170. That is, the complex member 180A is disposed farther from the display unit 130 than the metal layer 170 is.

The sealing unit 150 is hardened by heat to bond both the substrate 110 and the encapsulation unit 190A to the sealing unit 150. The encapsulation unit 190A may expand while heat is applied to the sealing unit 150. If the degree to which the encapsulation unit 190A is expanded by the heat is increased, a bonding force between the substrate 110 and the encapsulation unit 190A is reduced. In such a case, the durability of the display unit 100A may weaken.

However, according to the present embodiment of the present invention, the encapsulation unit 190A includes the complex member 180A having a low thermal expansion rate and thus is not greatly expanded. The complex member 180A has a thermal expansion rate that is lower than or similar to that of the substrate 110. The complex member 180A may include, as illustrated in FIGS. 2 and 3, a resin matrix and a plurality of carbon fibers.

Referring to FIG. 2, the complex member 180A may include a resin matrix 181 and a plurality of carbon fibers 182.

The complex member 180A is formed of the carbon fibers 182 impregnated in the resin matrix 181. The carbon fibers 182 are arranged to cross one another in rows and columns. That is, the carbon fibers 182 include carbon fibers arranged in an X-axis direction of FIG. 2 and carbon fibers 182 arranged in a Y-axis direction of FIG. 2. Accordingly, the complex member 180A having a uniform and low thermal expansion rate over the entire area may be formed. In FIG. 2, the carbon fibers 182 are arranged perpendicularly across one another. However, aspects of the present invention are not limited thereto, and an angle at which the carbon fibers 182 are arranged across one another may be determined such that the complex member 180A has a desired thermal expansion rate.

Also, the carbon fibers 182 are woven in a latitudinal and longitudinal direction. The carbon fibers 182 arranged in the X-axis direction of FIG. 2 and the carbon fibers 182 arranged in the Y-axis direction of FIG. 2 may be woven as a fabric. Consequently, a durability of the complex member 180A is increased.

The carbon fibers 182 have a lower thermal expansion rate than the substrate 110. In particular, the thermal expansion rate of the carbon fibers 182 in a lengthwise direction is a minus (−) value. The carbon fibers 182 do not absorb moisture, thus increasing the ability of the encapsulation unit 190A to prevent water penetration.

The resin matrix 181 has a thermal expansion rate of $15*10^{-6}$/K to $120*10^{-6}$/K. The complex member 180A having a predetermined thermal expansion rate is formed by mixing the carbon fibers 182 and the resin matrix 181. That is, the complex member 180A having a thermal expansion rate lower than or similar to a thermal expansion rate of the substrate 110 is formed. The complex member 180A is controlled to have the predetermined thermal expansion rate by adjusting an amount of the carbon fibers 182 and an amount of the resin matrix 181.

Referring to FIG. 3, according to another embodiment of the present invention, the complex member 180A includes layers, and each of the layers includes a resin matrix and carbon fibers. Also, each of the layers is formed of carbon fibers impregnated in the resin matrix. Each layer of the complex member 180A is formed to have carbon fibers arranged in a predetermined direction, and the layers are stacked on top of each other. Accordingly, the complex member 180A having the carbon fibers arranged to thereby cross one another is easily formed. The complex member 180A includes a first layer 183A, a second layer 183B, a third layer 183C, and a fourth layer 183D. Each of the first through fourth layers 183A to 183D respectively includes a resin matrix 181A, 181B, 181C, and 181D and carbon fibers 182A, 182B, 182C, and 182D, respectively.

A direction of the carbon fibers 182A and 182D of the first layer 183A and the fourth layer 183D and are disposed so as to cross a direction of the carbon fibers 182B and 182C of the second layer 183B and the third layer 183C. In detail, the carbon fibers 182A and 182D of the first layer 183A and the fourth layer 183D are arranged in a first direction (Y-axis direction of FIG. 3), and the carbon fibers 182B and 182C of the second layer 183B and the third layer 183C are arranged in a second direction (X-axis direction of FIG. 3). The first direction and the second direction cross each other so as to be perpendicular to each other, as shown in FIG. 3. However, aspects of the present invention are not limited thereto and the first direction and the second direction may cross each other at other suitable angles. For example, in order to adjust a desired thermal expansion rate of the complex member 180A, the carbon fibers 182A and 182D of the first layer 183A and the fourth layer 183D and the carbon fibers 182b and 182c of the second layer 1838 and the third layer 183C may be arranged at various angles.

Referring to FIG. 1, a shape of the encapsulation unit 190A is determined by a shape of the complex member 180A. Thus, the complex member 180A is molded as a hot plate by using a mold. A convex portion 185 of the encapsulation unit 190A that protrudes in a direction away from the display unit 130 is formed as a single unit with the complex member 180A and the metal layer 170. The convex portion 185 increases a height and a surface area of the complex member 180A. Accordingly, by increasing a total height and the surface area of the encapsulation unit 190A without increasing a thickness and weight of the encapsulation unit 190A, a surface moment of inertia is increased so as to increase rigidity of the encapsulation unit 190A and to prevent bending. When a height of the encapsulation unit 190A is three times a thickness of a typical flat encapsulation unit, the surface moment of inertia is increased by about 27 times (3^3), and thus the rigidity of the encapsulation unit 190A is significantly increased. Accordingly, a concave portion 189 is formed inside the encapsulation unit 190A due to the convex portion of the encapsulation unit 190A. Also, even when a getter used to absorb moisture inside the encapsulation unit 190A is inserted into the concave portion 189, the encapsulation unit 190A and the display unit 130 are prevented from contacting each other. The shape of the complex member 180A will be described later in detail with reference to FIGS. 4 through 8.

The metal layer 170 has a denser structure than the complex member 180A. The metal layer 170 and the complex member 180A are used together to prevent water and foreign materials from penetrating the display unit 130. The metal layer 170 has a higher thermal expansion rate than the complex member 180A. Also, the metal layer 170 has a greater thermal expansion rate than the substrate 110. However, since the encapsulation unit 190A includes the complex member 180A, a total thermal expansion rate of the encapsulation unit 190A is low. In detail, by forming the complex member 180A to be thicker than the metal layer 170, the thermal expansion rate of the encapsulation unit 190A is effectively maintained low.

The sealing unit 150 is disposed between the substrate 110 and the encapsulation unit 190A. The sealing unit 150 is formed around the display unit 130. The sealing unit 150 bonds the substrate 110 and the encapsulation unit 190A to the sealing unit 150 and includes a thermosetting resin. In detail, the sealing unit 150 may include an epoxy resin.

Figure 4:
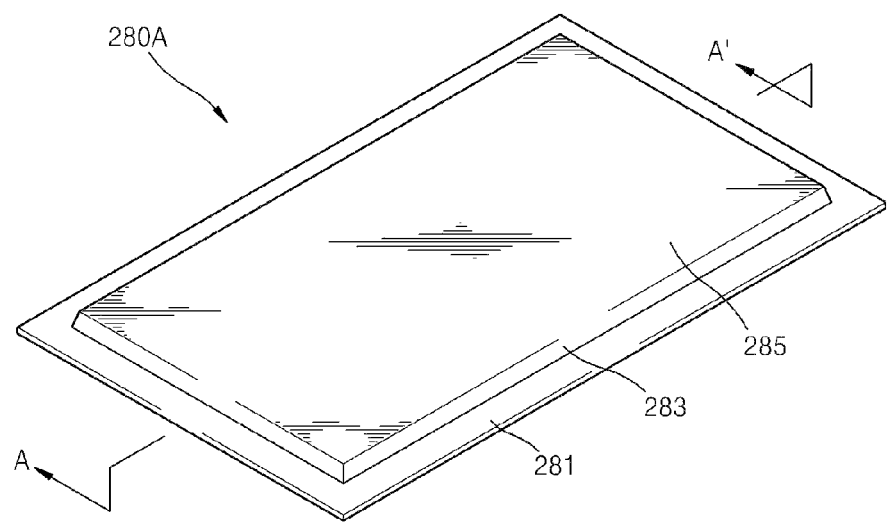
FIGS. 4 through 8 are perspective views illustrating various shapes of the complex member of FIG. 1.
Figure 4:
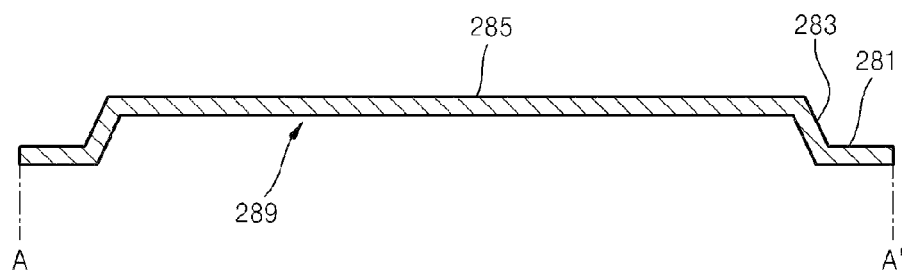

FIGS. 4 through 8 are perspective views illustrating various shapes of the complex member 180A of FIG. 1. In upper portions of FIGS. 4 through 8, perspective views of the complex member 180A are illustrated, and in lower portions of FIGS. 4 through 8, cross-sectional views of the complex member 180A taken along a line A-A' of FIGS. 4 through 8 and a line B-B' of FIGS. 7 and 8 of the above perspective views are illustrated. Referring to FIG. 4, a complex member 280A includes a base unit 281, a convex portion 285 that protrudes from the base unit 281 to a predetermined height, and an inclination unit 283 connecting the base unit 281 and the convex portion 285.

The complex member 280A has a first surface facing the substrate 110 and a second surface opposite to the first surface. A first surface of the base unit 281 contacts the sealing unit 150.

The convex portion 285 is square-shaped and protrudes upward from the base unit 281 in a direction away from the substrate 110. Thus a total height and a surface area of the complex member 280A are increased. A concave portion 289 is formed inside the complex member 280A due to the convex portion 285. A metal layer 170 is formed under the complex member 280A. Although aspects of the present invention are not limited to the following, a getter may be further disposed in the concave portion 289.

Figure 5:
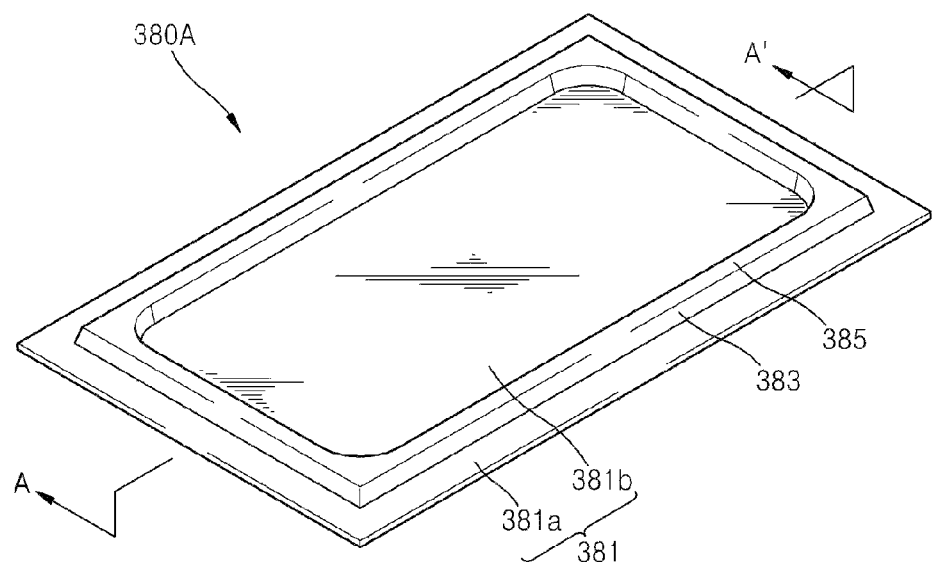
Figure 5:
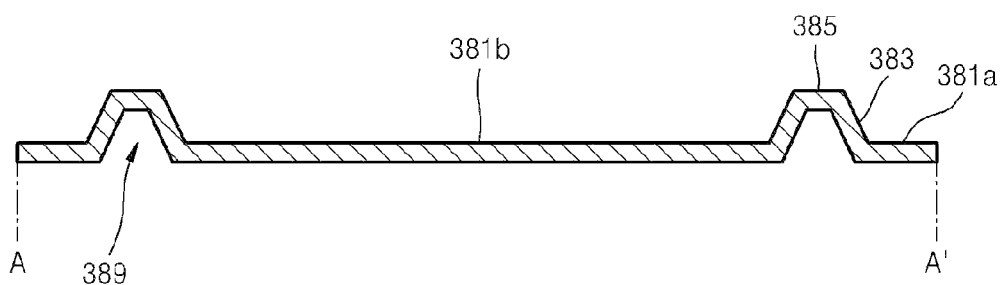

Referring to FIG. 5, a complex member 380A includes a base unit 381, a convex portion 385 that protrudes from the base unit 381 to a predetermined height, and an inclination unit 383 connecting the base unit 381 and the convex portion 385. The complex member 380A has a first surface facing the substrate 110 and a second surface opposite to the first surface. The base unit 381 includes a first region 381a whose first surface contacts the sealing unit 150 and a second region 381b having a square shape with four curved corners. The convex portion 385 borders the first region 381a and the second region 381b.

The convex portion 385 has a shape of a square ring. The convex portion 385 protrudes upward from the base unit 381 in a direction away from the substrate 110, and thus a total height of the complex member 380A is increased. A concave portion 389 having a square-ring shape is formed inside the complex member 380A due to the convex portion 385. A metal layer 170 is disposed under the complex member 380A. Although not required in all aspects of the present invention, a getter may be further disposed in the concave portion 389.

Figure 6:
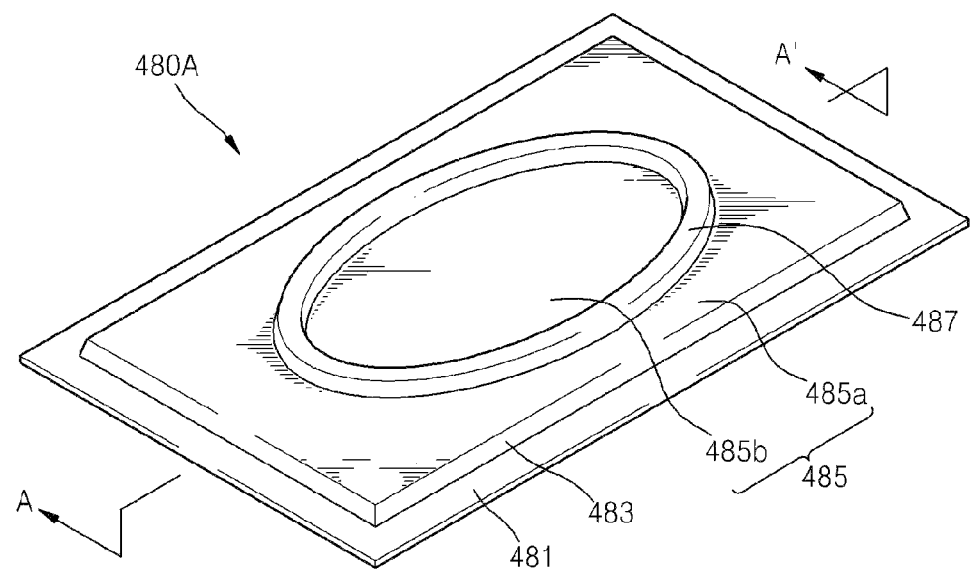
Figure 6:
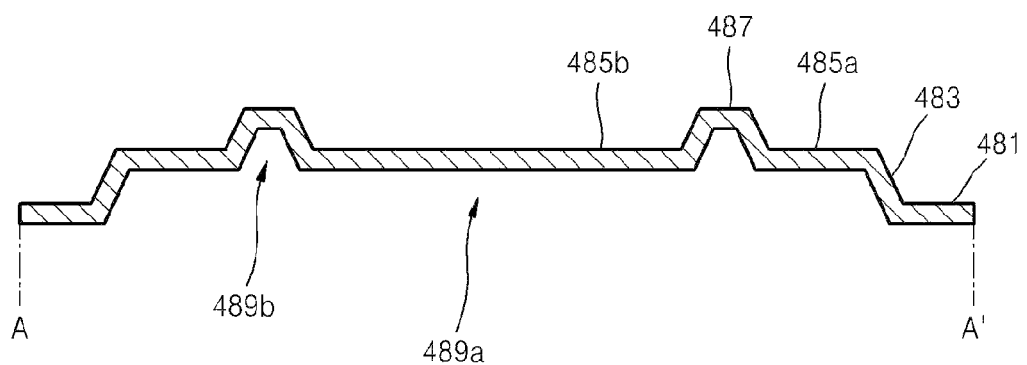

Referring to FIG. 6, a complex member 480A includes a base unit 481, a first convex portion 485 that protrudes from the base unit 481 to a predetermined height, an inclination unit 483 connecting the base unit 481 and the first convex portion 485, and a second convex portion 487 that protrudes from the first convex portion 485 to another predetermined height.

The complex member 480A has a first surface facing the substrate 110 and a second surface opposite to the first surface. A first surface of the base unit 481 contacts the sealing unit 150. The first convex portion 485 has a shape of a square plate. The first convex portion 485 includes a first region 485a and a second region 485b, the second region 485b having an oval shape. The second convex portion 487 borders the first region 485a and the second region 485b.

The second convex portion 487 has a shape of an oval ring, and protrudes upward from the first convex portion 485. The first convex portion 485 and the second convex portion 487 sequentially protrude upward from the base unit 481 in a direction away from the substrate 110. Thus, a total height and surface area of the complex member 480A are increased. A square-shaped concave portion 489a is formed inside the complex member 480A due to the first convex portion 485. An oval-shaped concave portion 489b is further formed in the square-shaped concave portion 489a due to the second convex portion 487. A metal layer 170 is disposed under the complex member 480A. Although aspects of the present invention are not limited thereto, a getter may be further disposed in the concave portions 489a and 489b.

Figure 7:
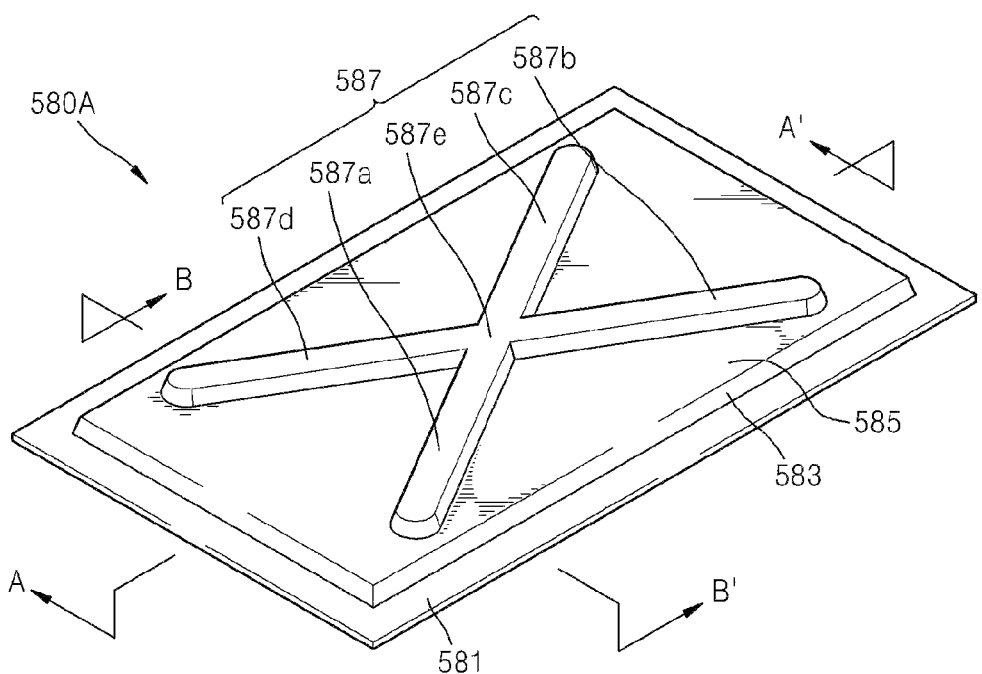
Figure 7:
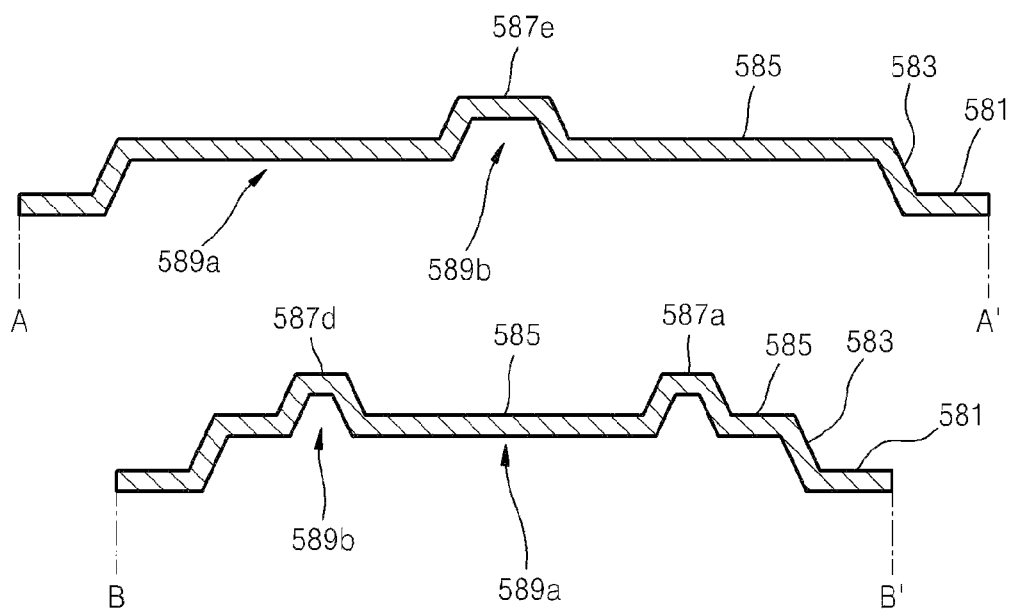

Referring to FIG. 7, a complex member 580A includes a base unit 581 and a first convex portion 585 that protrudes from the base unit 581 to a predetermined height. The complex member 580A also includes an inclination unit 583 connecting the base unit 581 and the first convex portion 585, and a second convex portion 587 that protrudes from the first convex portion 585 to another predetermined height.

The complex member 580A has a first surface facing the substrate 110 and a second surface opposite to the first surface. The first surface of the base unit 581 contacts the sealing unit 150. The first convex portion 585 has a shape of a square plate. The second convex portion 587 protrudes upward from the first convex portion 585. The second convex portion 587 has an X-shape such that lines of the X-shape extend in a diagonal direction across the complex member 580A. The second convex portion 587 is formed of a center portion 587e and ribs 587a, 587b, 587c, and 587d, each having a stripe shape extending from the center portion 587e.

The first convex portion 585 and the second convex portion 587 sequentially protrude upward from the base unit 581 in a direction away from the substrate 110. As such, a total height and surface area of the complex member 580A are increased. A square-shaped concave portion 589a is formed inside the complex member 580A by the first convex portion 585. An X-shaped concave portion 589b is further formed in the square-shaped concave portion 589a due to the second convex portion 587. A metal layer 170 is formed under the complex member 580A. Although aspects of the present invention are not limited thereto, a getter may be further disposed in the concave portions 589a and 589b.

Figure 8:
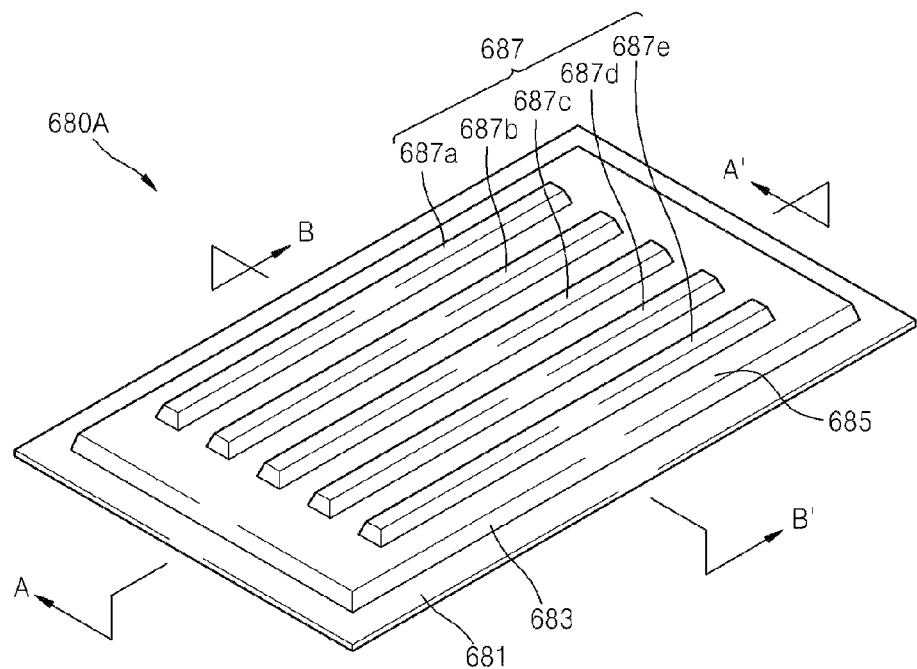
Figure 8:
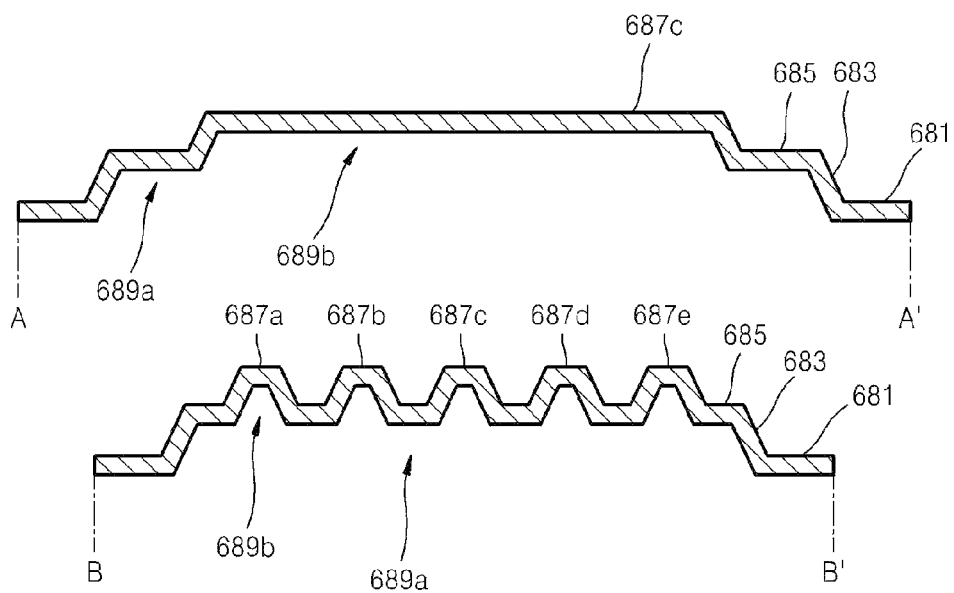

Referring to FIG. 8, the complex member 680A includes a base unit 681 and a first convex portion 685 that protrudes from the base unit 681 to a predetermined height. The complex member 680A also includes an inclination unit 683 connecting the base unit 681 and the first convex portion 685, and a second convex portion 687 that protrudes from the first convex portion 685 to another predetermined height. The complex member 680A has a first surface facing the substrate 110 and a second surface opposite to the first surface. The first surface of the base unit 681 contacts the sealing unit 150. The first convex portion 685 has a shape of a square plate.

The second convex portion 687 is formed of at least one rib. As shown in FIG. 8, the second convex portion 687 is formed of ribs 687a, 687b, 687c, 687d, and 687e, each having a stripe shape and are arranged to be parallel. In the current embodiment, five ribs are illustrated in FIG. 8. However, aspects of the present invention are not limited thereto, and the second convex portion 687 may have any suitable number of ribs in a variety of suitable patterns.

The first convex portion 685 and the second convex portion 687 sequentially protrude upward from the base unit 681 in a direction away from the substrate 110. Thus a total height of the complex member 680A is increased. A square-shaped concave portion 689a is formed in the complex member 680A due to the first convex portion 685. Concave portions 689b, each having a stripe shape, are further formed in the square-shaped concave portion 689a due to the ribs 687a through 687e formed in the second convex portion 687. A metal layer 170 is disposed under the complex member 680A. Although aspects of the present invention are not limited thereto, a getter may be further disposed in the concave portions 689a and 689b.

Figure 9:
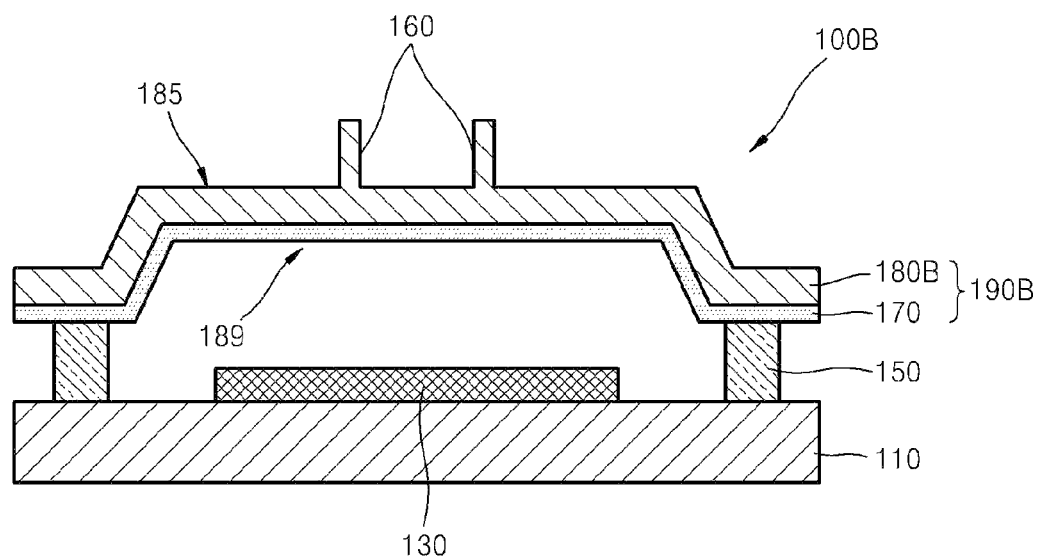
FIG. 9 is a cross-sectional view illustrating a display apparatus according to another embodiment of the present invention.

FIG. 9 is a cross-sectional view illustrating a display apparatus 100B according to another embodiment of the present invention. Referring to FIG. 9, the display apparatus 100B includes a substrate 110, a display unit 130, an encapsulation unit 190B, and a sealing unit 150. The display apparatus 100B of FIG. 9 is generally the same as the display apparatus 100A of FIG. 1, except for a shape of a complex member 180B. Thus, descriptions of repeated components will be omitted below.

The encapsulation unit 190B is disposed so as to face the display unit 130. The encapsulation unit 190B protects the display unit 130 from water, oxygen and other foreign materials coming from outside of the display apparatus 100B. The encapsulation unit 190B includes a metal layer 170 and a complex member 180B. The complex member 180B is formed on the metal layer 170. That is, the complex member 180B is disposed further away from the display unit 130 than the metal layer 170 is. The complex member 180B includes a resin matrix and carbon fibers as illustrated in FIGS. 2 and 3.

A shape of the encapsulation unit 190B is determined by a shape of the complex member 180B. The complex member 180B is molded as a hot plate by using a mold. The encapsulation unit 190B includes a convex portion 185 separated from the display unit 130. Thus, a total height and surface area of the encapsulation unit 190B are increased. Accordingly, by increasing a surface moment of inertia by increasing the total height of the encapsulation unit 190B, rigidity of the encapsulation unit 190B is increased without increasing the thickness or weight of the encapsulation unit 190B. By increasing a rigidity of the encapsulation unit 190B, bending of the encapsulation unit 190B may be prevented. When a height of the encapsulation unit 190B is three times a thickness of a flat encapsulation unit, the surface moment of inertia is increased by about 27 times (3^3), and thus the rigidity of the encapsulation unit 190B is significantly increased. Accordingly, a concave portion 189 is formed inside the encapsulation unit 190B due to the convex portion. Accordingly, when a getter is inserted into the concave portion 189, the encapsulation unit 190B and the display unit 130 are prevented from contacting each other. The shape of the complex member 180A will be described in detail with reference to FIGS. 10 through 15. The encapsulation unit 190B may further include a protrusion 160 formed in an area of an upper surface of the encapsulation unit 190B.

The protrusion 160 is a connection member connecting an external device (not shown), such as a printed circuit board (PCB), to the display unit 100B. For example, the protrusion 160 may have a bolt shape having a threaded outer surface, or other suitable shapes. The protrusion 160 is formed as a single unit with the complex member 180B of the encapsulation unit 190B and as an uppermost layer of the complex member 180B. Positions, heights of the protrusion 160 and the number of protrusions 160 are determined according to a type of external devices to be connected to the display unit 100B. However, aspects of the present invention are not limited thereto, and the protrusion 160 may be formed to not be a single unit with the complex member 180B and the position, height and number of protrusions 60 may be determined according to other suitable requirements.

FIGS. 10 through 15 are perspective views illustrating various shapes of the complex member 180B of FIG. 9. In upper portions of FIGS. 10 through 15, perspective views of the complex member 180B are illustrated, and in lower portions of FIGS. 10 through 15, cross-sectional views of the complex member 180B taken along a line A-A' in FIGS. 10-15 and a line B-B' in FIGS. 13-15 of the above perspective views are illustrated.

Figure 10:
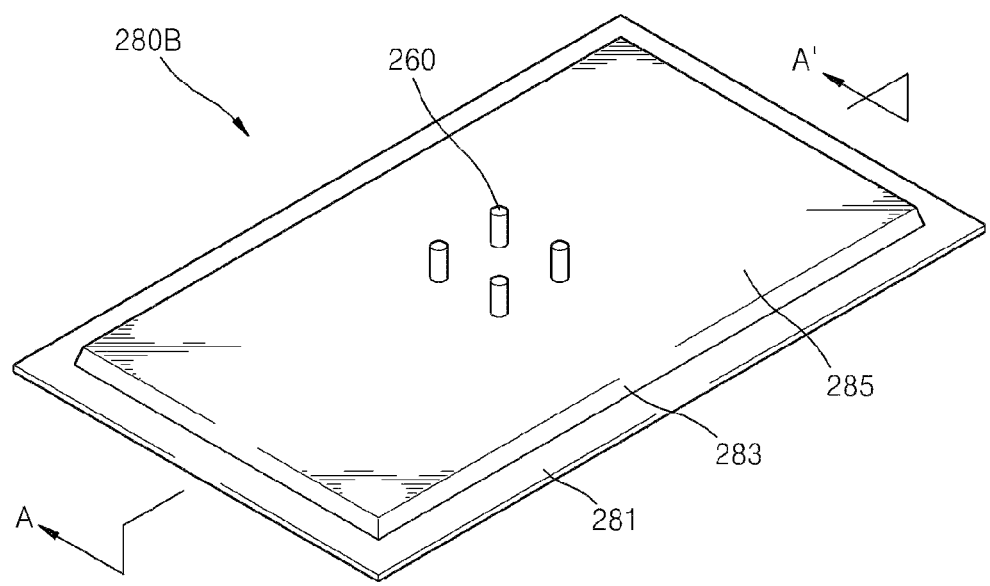
FIGS. 10 through 15 are perspective views illustrating various shapes of a complex member of FIG. 9.
Figure 10:
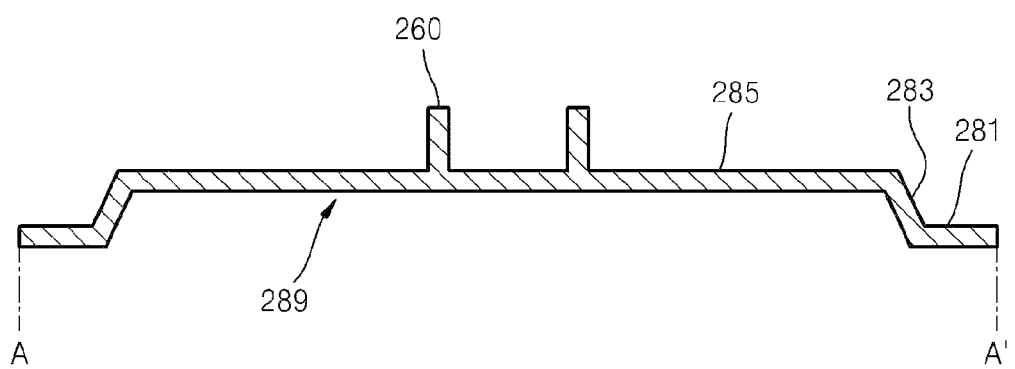

Referring to FIG. 10, a complex member 280B includes a base unit 281, a convex portion 285 that protrudes from the base unit 281 to a predetermined height, and an inclination unit 283 connecting the base unit 281 and the convex portion 285. The complex member 280B has a first surface facing the substrate 110 and a second surface opposite to the first surface. The first surface of the base unit 281 contacts the sealing unit 150.

At least one protrusion 260 is formed on an upper surface of the convex portion 285 to connect to an external device (not shown). The convex portion 285 protrudes upward from the base unit 281 in a direction away from the substrate 110, and thus a total height and surface area of the complex member 280B are increased. A concave portion 289 is formed in the complex member 280B due to the convex portion 285. A metal layer 170 is disposed under the complex member 280B. Although not required in all aspects of the present invention, a getter may be further disposed in the concave portion 289.

Figure 11:
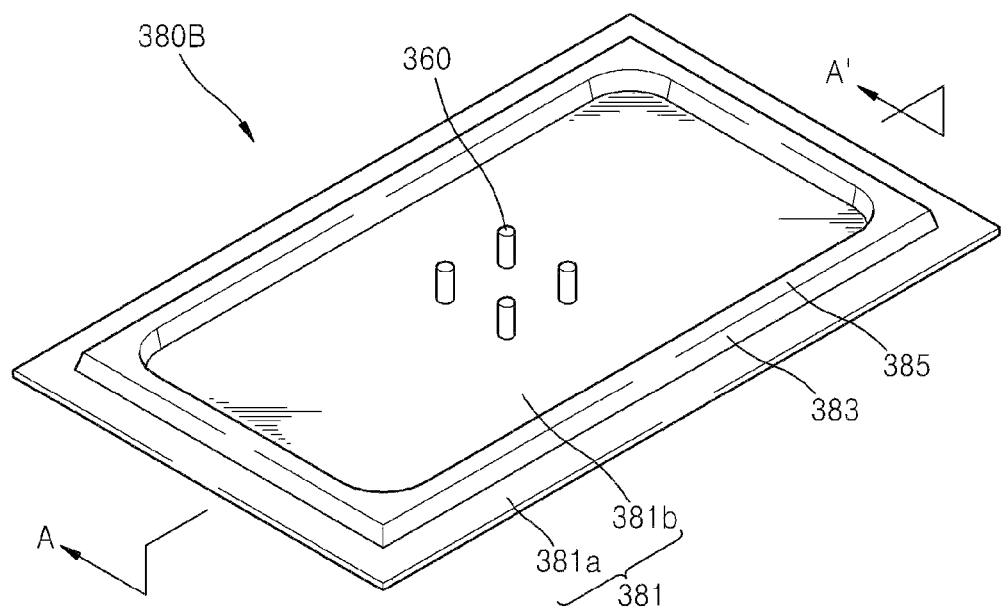
Figure 11:
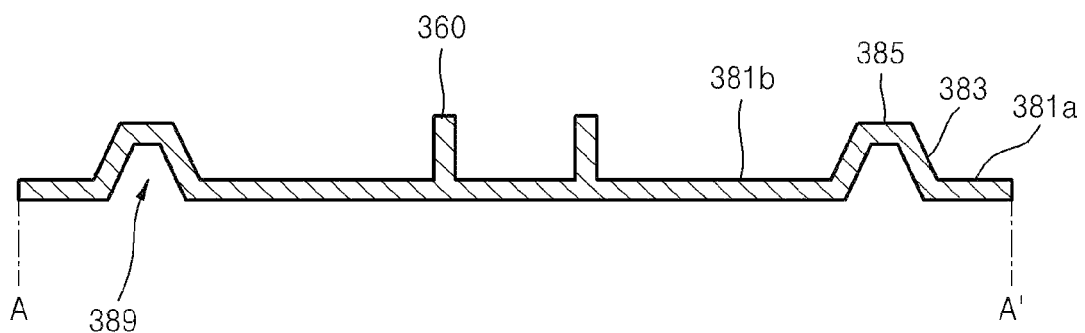

Referring to FIG. 11, a complex member 380B includes a base unit 381, a convex portion 385 that protrudes from the base unit 381 to a predetermined height, and an inclination unit 383 connecting the base unit 381 and the convex portion 385. The complex member 380B has a first surface facing the substrate 110 and a second surface opposite to the first surface. The base unit 381 includes a first region 381a whose first surface contacts the sealing unit 150 and a second region 381b having a square shape with four curved corners. The first region 381a and the second region 381b are bordered by the convex portion 385.

At least one protrusion 360 is formed in the second region 381b of the base unit 381 to connect to an external device (not shown). The convex portion 385 has a shape of a square ring. The convex portion 385 protrudes upward from the base unit 381 in a direction away from the substrate 110, and thus the total height of the complex member 380B is increased. A concave portion 389 having a square-ring shape is formed inside the complex member 380B due to the convex portion 385. A metal layer 170 is disposed under the complex member 380B. Although not required in all aspects of the present invention, a getter may be further disposed in the concave portion 389.

Figure 12:
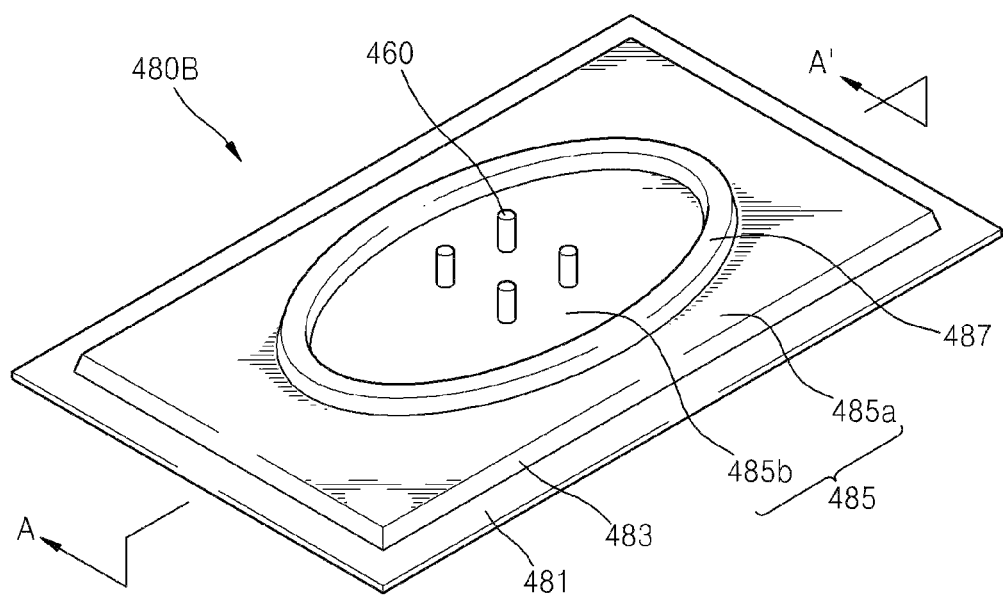
Figure 12:
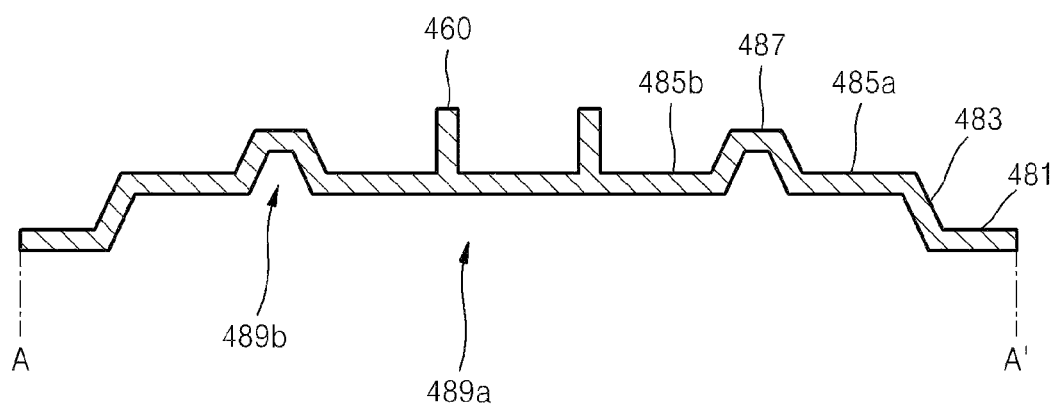

Referring to FIG. 12, a complex member 480B includes a base unit 481, a first convex portion 485 that protrudes from the base unit 481 to a predetermined height, an inclination unit 483 connecting the base unit 481 and the first convex portion 485, and a second convex portion 487 that protrudes from the first convex portion 485 to another predetermined height. The complex member 480B has a first surface facing the substrate 110 and a second surface opposite to the first surface. The first surface of the base unit 481 contacts the sealing unit 150.

The first convex portion 485 has a shape of a square plate. The first convex portion 485 includes a first region 485a and a second region 485b, the second region 485b having an oval shape. The first region 485a and the second region 485b are bordered by the second convex portion 487. At least one protrusion 460 is formed in the second region 485b of the first convex portion 485 to connect to an external device (not shown). The second convex portion 487 has an oval ring shape, and protrudes upward from the first convex portion 485.

The first convex portion 485 and the second convex portion 487 sequentially protrude upward from the base unit 481 in a direction away from the substrate 110. Thus, a total height and surface area of the complex member 480B are increased. A square-shaped concave portion 489a is formed inside the complex member 480B due to the first convex portion 485. An oval-shaped concave portion 489b is further formed in the square-shaped concave portion 489a due to the second convex portion 487. A metal layer 170 is disposed under the complex member 480B. Although not required in all aspects of the present invention, a getter may be further disposed in the concave portions 489a and 489b.

Figure 13:
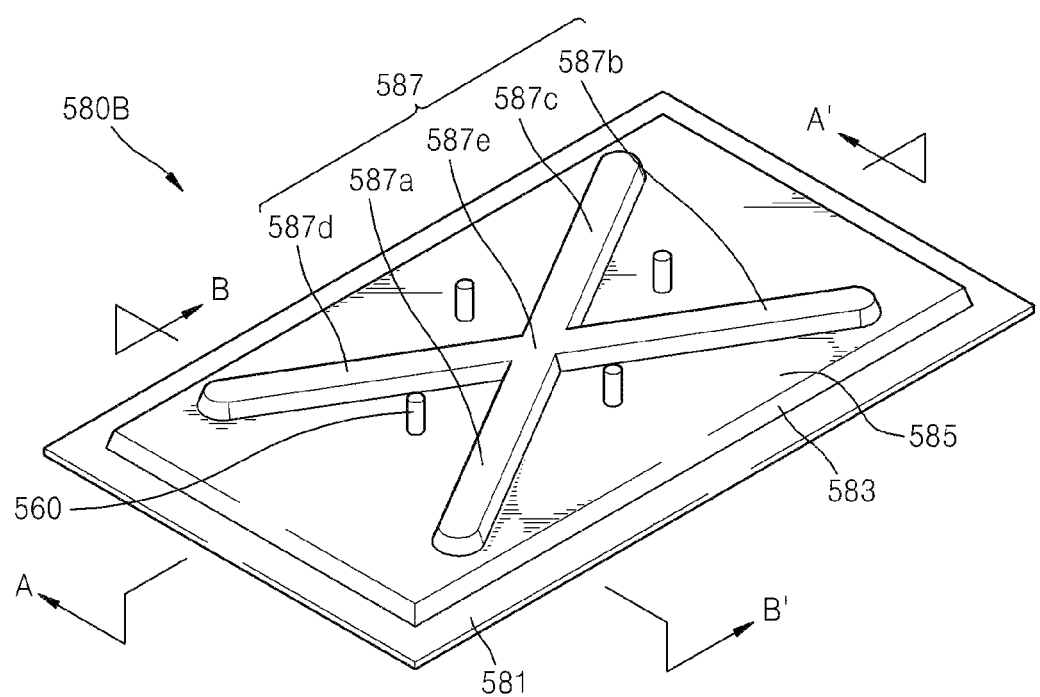
Figure 13:
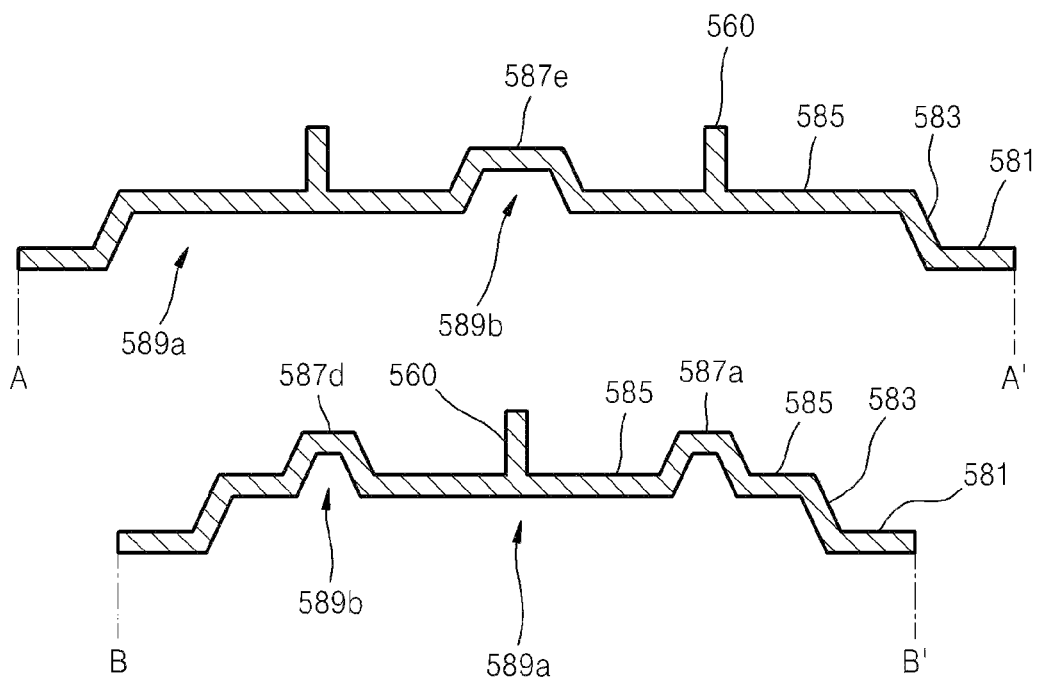

Referring to FIG. 13, a complex member 580B includes a base unit 581 and a first convex portion 585 that protrudes from the base unit 581 to a predetermined height. The complex member 580B also includes an inclination unit 583 connecting the base unit 581 and the first convex portion 585, and a second convex portion 587 that protrudes from the first convex portion 585 to another predetermined height. The complex member 580B has a first surface facing the substrate 110 and a second surface opposite to the first surface. The first surface of the base unit 581 contacts the sealing unit 150. The first convex portion 585 has a shape of a square plate.

The second convex portion 587 protrudes upward from the first convex portion 585. The second convex portion 587 has an X-shape, such that lines of the X-shape extend in diagonal directions of the complex member 580B. The second convex portion 587 is formed of a center portion 587e and ribs 587a, 587b, 587c, and 587d. The ribs 587a to 587d each have a stripe shape that branches from the center portion 587e. At least one of protrusions 560 is formed between two adjacent ones of the ribs 587a, 587b, 587c, and 587d to connect to an external device (not shown).

As the first convex portion 585 and the second convex portion 587 sequentially protrude upward from the base unit 581 in a direction away from the substrate 110, a total height and surface area of the complex member 580B are increased. A square-shaped concave portion 589a is formed inside the complex member 580B due to the first convex portion 585. An X-shaped concave portion 589b is further formed in the square-shaped concave portion 589a by the second convex portion 587. A metal layer 170 is formed under the complex member 580B. Although not required in all aspects of the present invention, a getter may be further disposed in the concave portions 589a and 589b.

Figure 14:
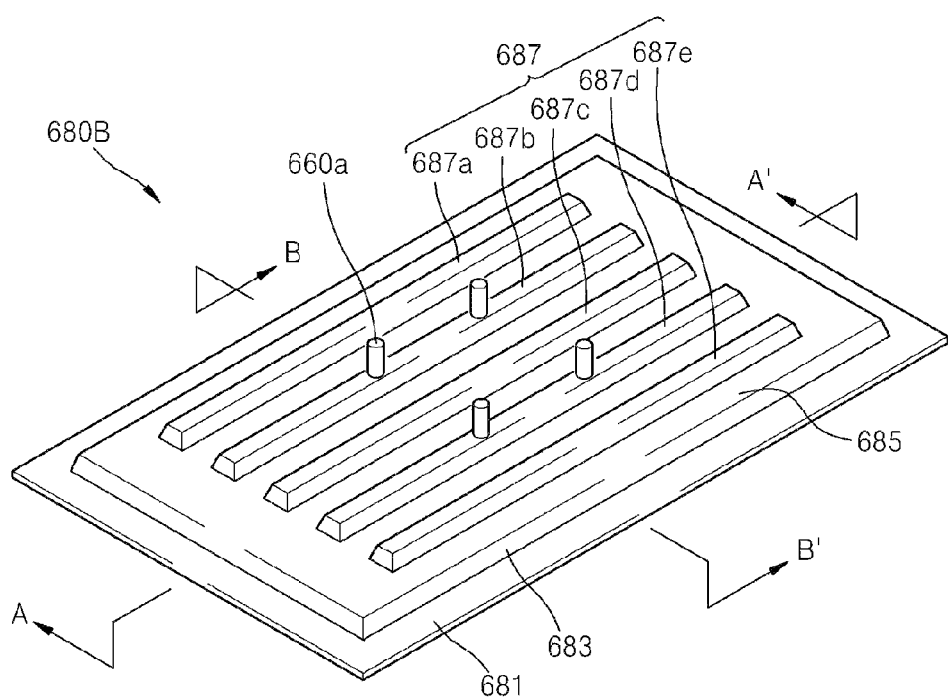
Figure 14:
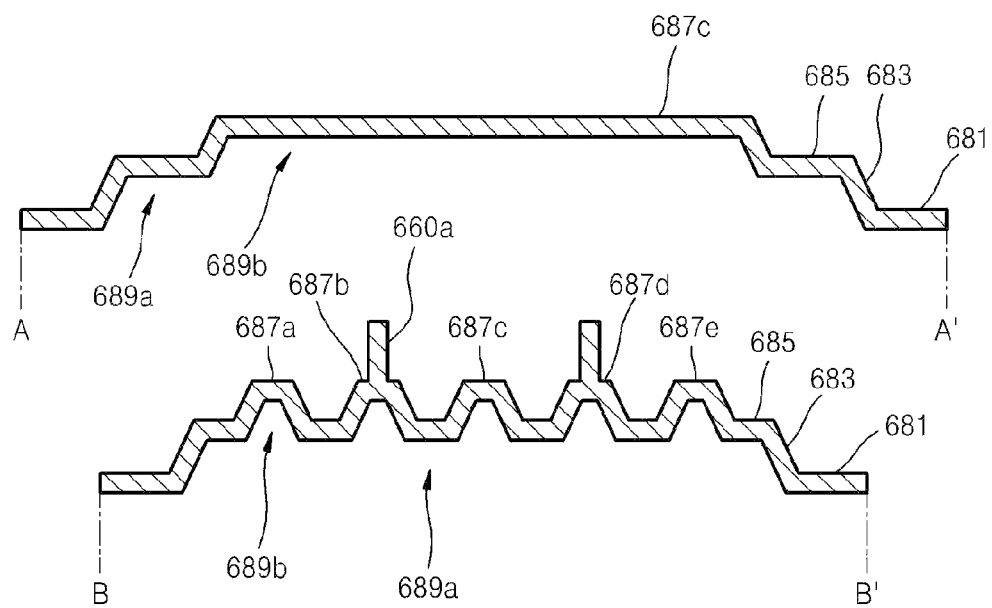
Figure 15:
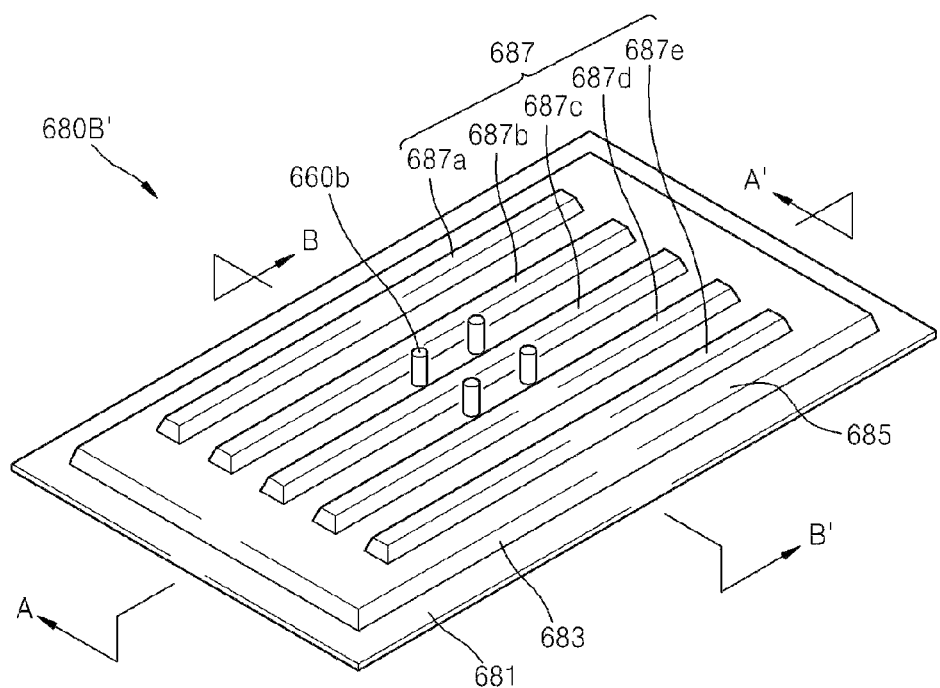
Figure 15:
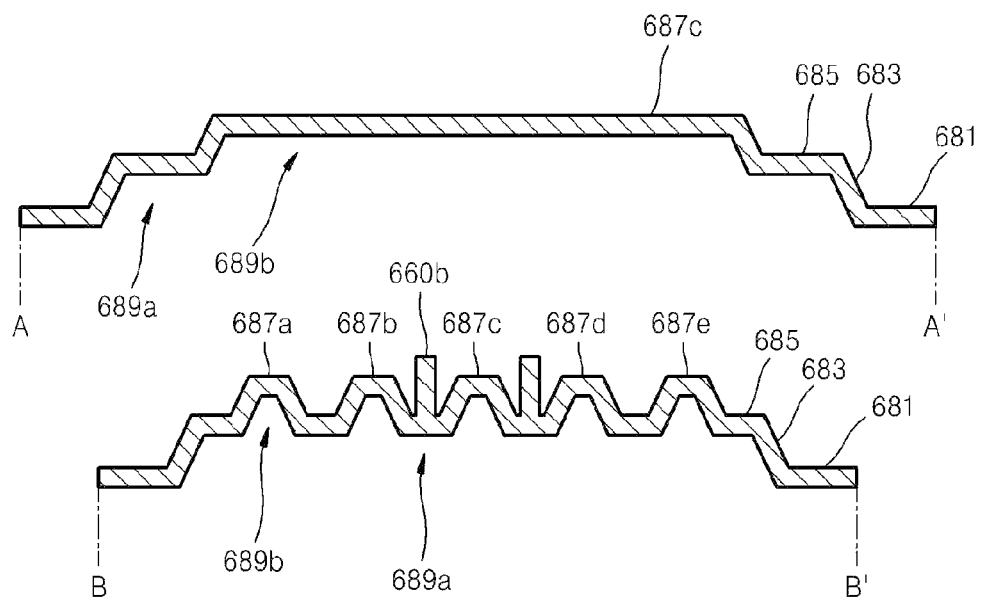

Referring to FIGS. 14 and 15, complex members 680B and 680B' each include a base unit 681 and a first convex portion 685 that protrudes from the base unit 681 to a predetermined height. The complex members 680B and 680B' also include an inclination unit 683 connecting the base unit 681 and the first convex portion 685, and a second convex portion 687 that protrudes from the first convex portion 685 to another predetermined height. Each of the complex members 680B and 680B' has a first surface facing the substrate 110 and a second surface opposite to the first surface. The first surface of the base unit 681 contacts the sealing unit 150. The first convex portion 685 has a shape of a square plate.

The second convex portion 687 is formed of at least one rib. As shown in FIGS. 14 and 15, ribs 687a, 687b, 687c, 687d, and 687e have a stripe shape and are arranged to be parallel to each other. According to the present embodiment, five ribs are illustrated in FIGS. 14 and 15, however, aspects of the present invention are not limited thereto and the second convex portion 687 may be formed of other suitable numbers of ribs.

As illustrated in FIG. 14, at least one of protrusions 660a is formed on the at least one of the ribs 687a, 687b, 687c, 687d, and 687e to be connect to an external device (not shown). Alternatively, as illustrated in FIG. 15, at least one of protrusions 660b is formed between at two of the ribs 687a, 687b, 687c, 687d, and 687e formed on the first convex portion 685 to connect to an external device (not shown). In other words, as shown in FIG. 14, the protrusions 660a are formed on some of the ribs 687a to 687e, and as shown in FIG. 15, the protrusions are formed between some of the ribs 687a to 687e.

As the first convex portion 685 and the second convex portion 687 sequentially protrude upward from the base unit 681 in a direction away from the substrate 110, a total height and surface area of the complex member 680B are increased. A square-shaped concave portion 689a is formed inside the complex member 680B due to the first convex portion 685 An X-shaped concave portion 689b is further formed in the square-shaped concave portion 689a by the second convex portion 687. A metal layer 170 is formed under the complex member 680B. Although not required in all aspects of the present invention, a getter may be further disposed in the concave portions 689a and 689b.

Figure 16:
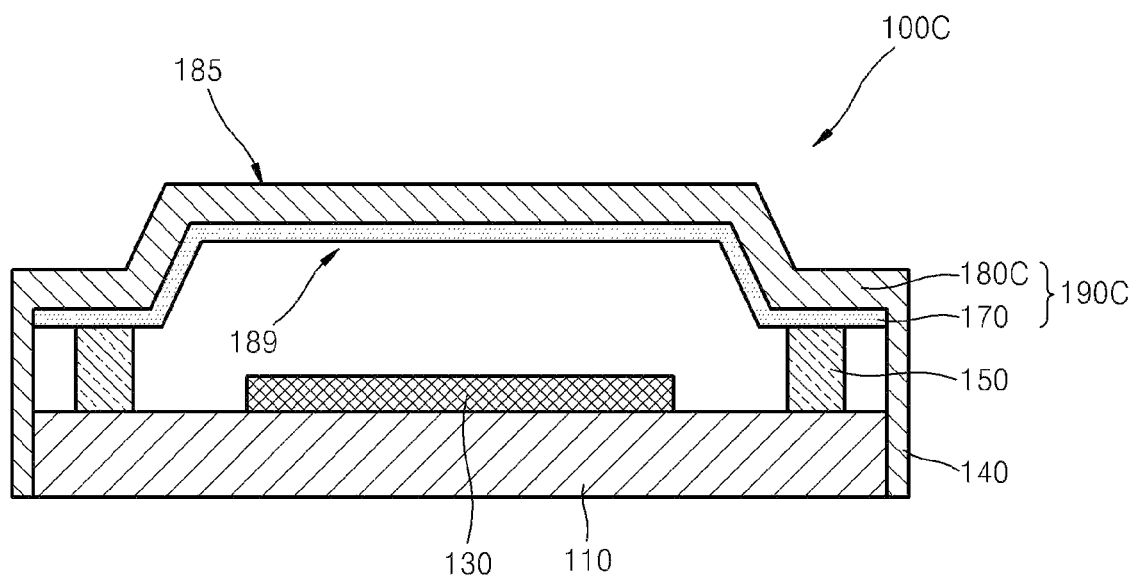
FIG. 16 is a cross-sectional view illustrating a display apparatus according to another embodiment of the present invention.
Figure 17:
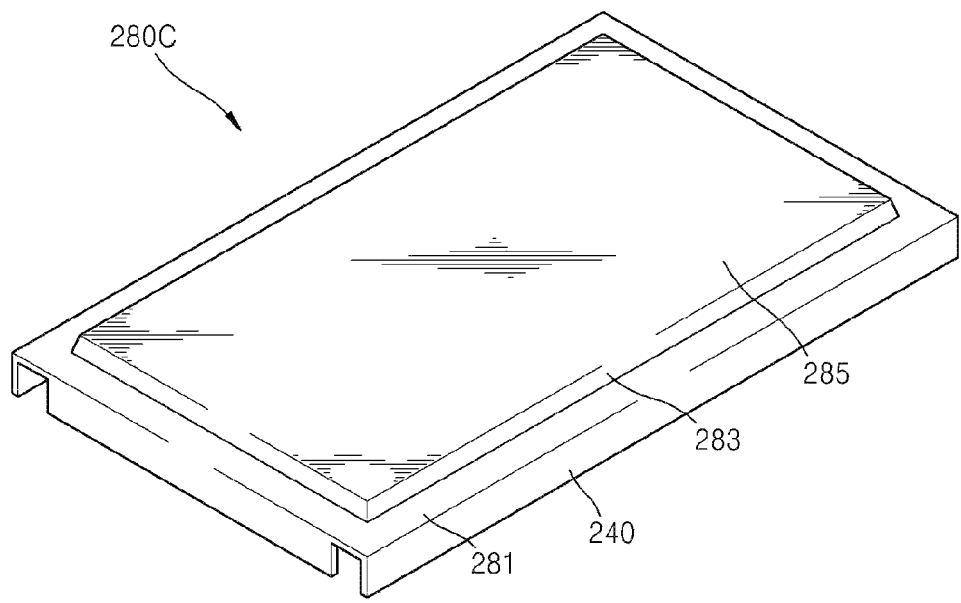
FIGS. 17 through 21 are perspective views illustrating various shapes of a complex member of FIG. 16.
Figure 18:
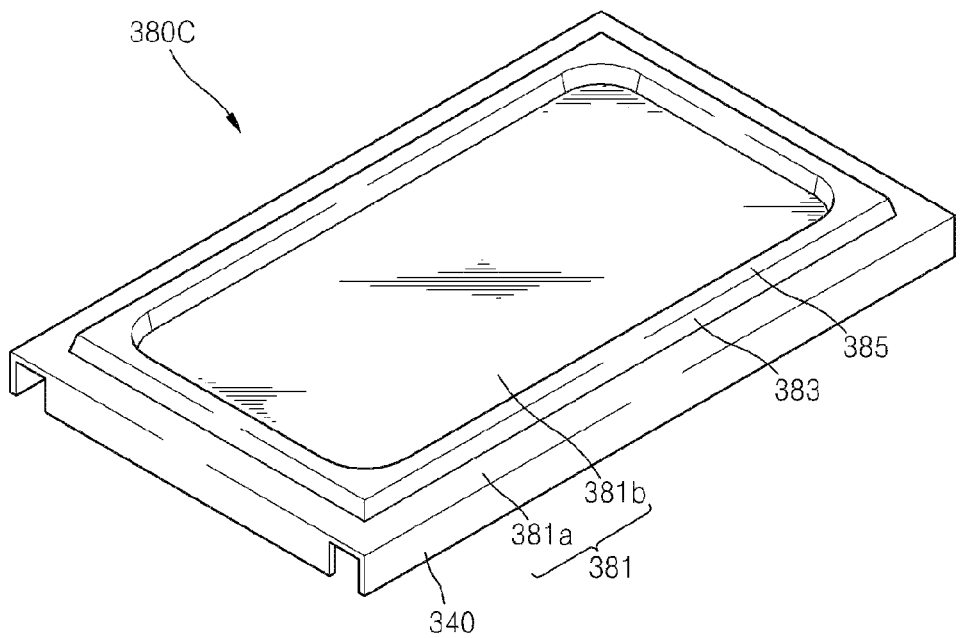
Figure 19:
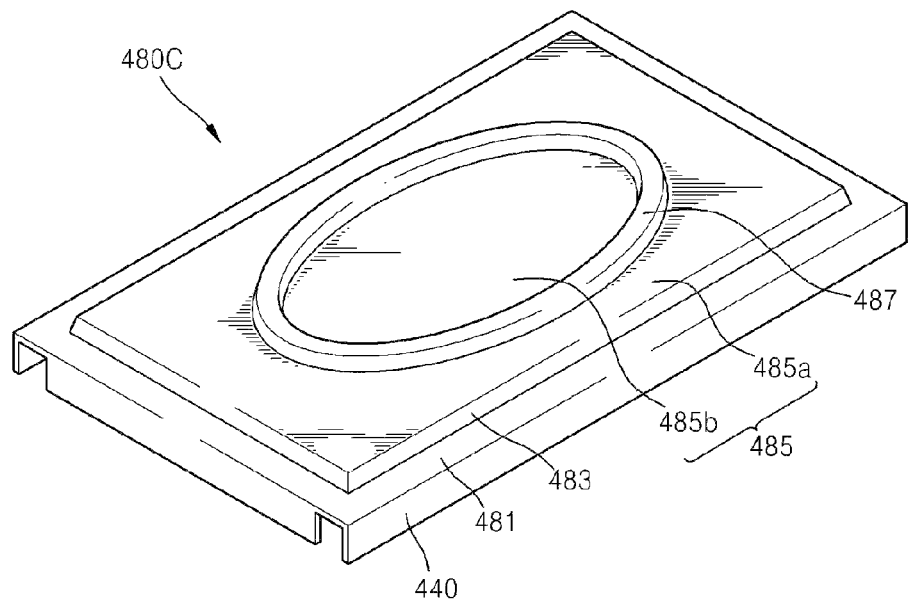
Figure 20:
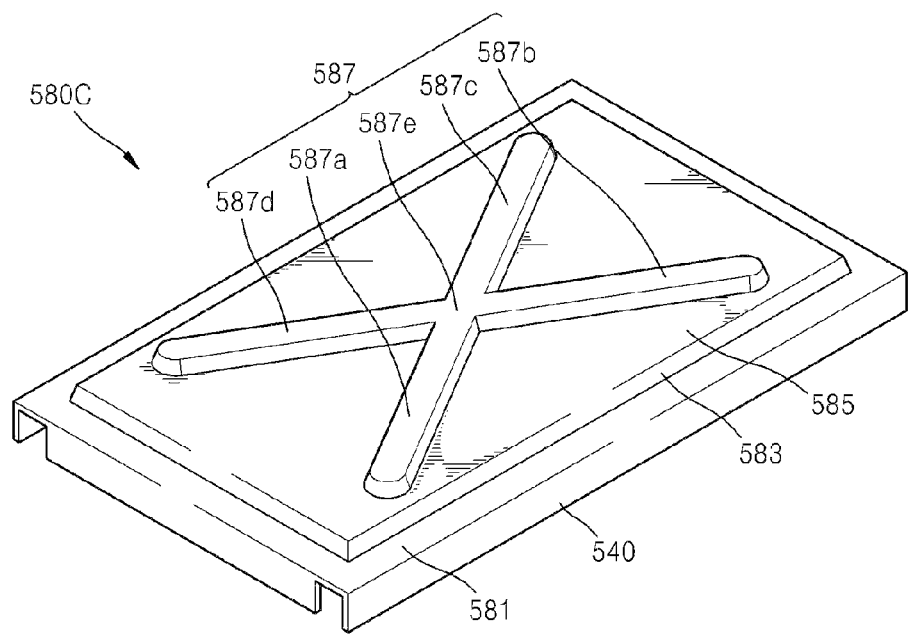
Figure 21:
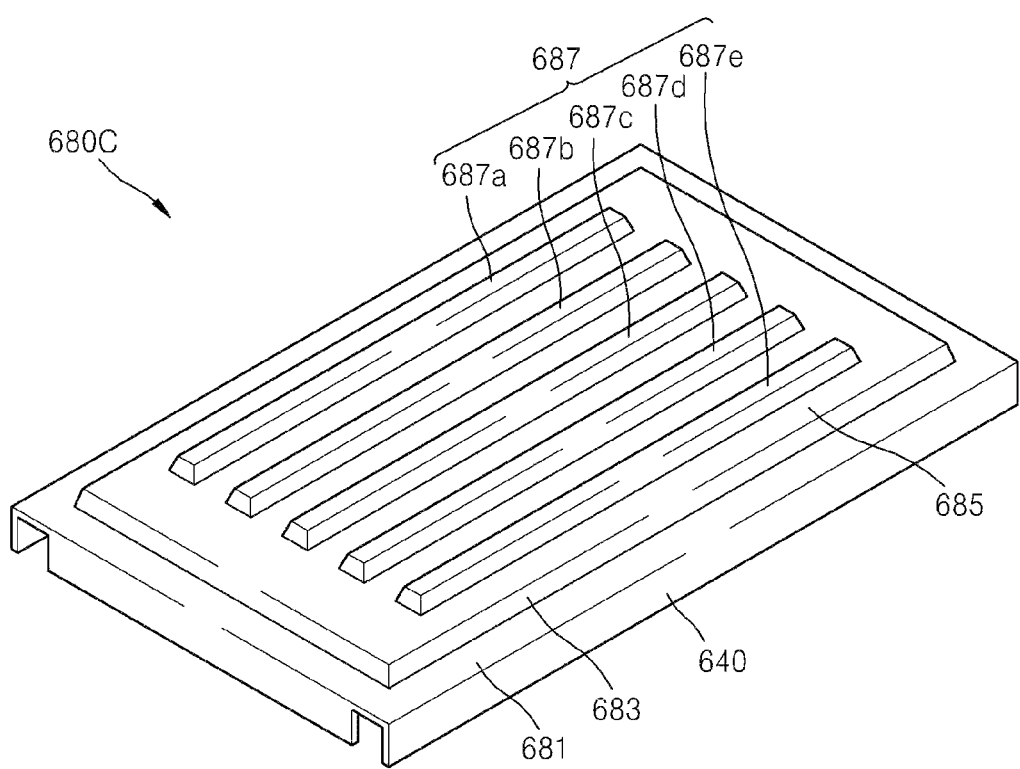

FIG. 16 is a cross-sectional view illustrating a display apparatus 100C according to another embodiment of the present invention. FIGS. 17 through 21 are perspective views illustrating various shapes of the complex member of FIG. 16. Referring to FIG. 16, the display apparatus 100C includes a substrate 110, a display unit 130, an encapsulation unit 190C, and a sealing unit 150. The display apparatus 100C of FIG. 16 is generally the same as the display apparatus 100A of FIG. 1. However, a shape of a complex member 180C is different from the shape of the complex member 180A of the display apparatus 100A of FIG. 1. Thus, description of repeated components will be omitted below.

The encapsulation unit 190C is disposed to face the display unit 130. The encapsulation unit 190C includes a metal layer 170 and the complex member 180C. The complex member 180C is formed on the metal layer 170. That is, the complex member 180C is disposed farther away from the display unit 130 than the metal layer 170 is. The complex member 180C includes a resin matrix and carbon fibers as illustrated in FIGS. 2 and 3.

A shape of the encapsulation unit 190C is determined by a shape of the complex member 180C. The complex member 180C is molded as a hot plate by using a mold. However, aspects of the present invention are not limited thereto and the complex member 180C may be formed using other suitable methods. The encapsulation unit 190C includes a convex portion 185 extending in a direction away from the display unit 130 to thereby increase the height and surface area of the encapsulation unit 190C. Accordingly, a surface moment of inertia is increased by increasing a total height of the encapsulation unit 190C without increasing a thickness or weight of the encapsulation unit 190C. Thus, a rigidity of the encapsulation unit 190C is increased so as to prevent bending. A concave portion 189 is formed in the encapsulation unit 190C due to the convex portion. Thus, even when a getter is formed in the concave portion 189, contact between the encapsulation unit 190C and the display unit 130 may be prevented.

The complex member 180C of the encapsulation unit 190C may have various shapes as illustrated in FIGS. 4 through 8. Also, the complex member 180C may include a protrusion (not shown) formed in an area of an upper surface of the complex member 180C to connect to an external device, as illustrated in FIGS. 10 through 15.

The complex member 180C includes an extension portion 140 that extends from an edge of the complex member 180C along the substrate 110 in a vertical direction in order to protect the substrate 110. The extension portion 140 is formed as a single unit with the complex member 180C. The extension portion 140 is formed to surround edges of the substrate 110 to prevent the edge from colliding with other objects. Accordingly, the encapsulation unit 190C ensures increased rigidity but also a durable structure with respect to handling or dynamic impact.

The complex member 180C has various shapes as shown by complex members 280C, 380C, 480C, 580C, and 680C illustrated in FIGS. 17 through 21. The complex members 280C, 380C, 480C, 580C, and 680C respectively include extension portions 240, 340, 440, 540, and 640 extending from edges thereof along the substrate 110 in a vertical direction. The extension portions 140 to 640 are formed to surround all edges of the substrate 110. Additionally, a portion of each of the extension portions 140 to 640 is formed to be opened as illustrated in FIGS. 17 through 21. The extension portions 140 to 640 are formed to cover circuit wiring that extends out of the substrate 110. Alternatively, the open portion of each of the extension portions 140 to 640 is disposed in a manner corresponding to the circuit wiring to increase convenience of assembly during an assembling process.

Other components of the display apparatus 100C illustrated in FIGS. 17 through 21 are the same as those in FIGS. 4 through 8 and FIGS. 10 through 15, and thus descriptions thereof will be omitted below.

Figure 22:
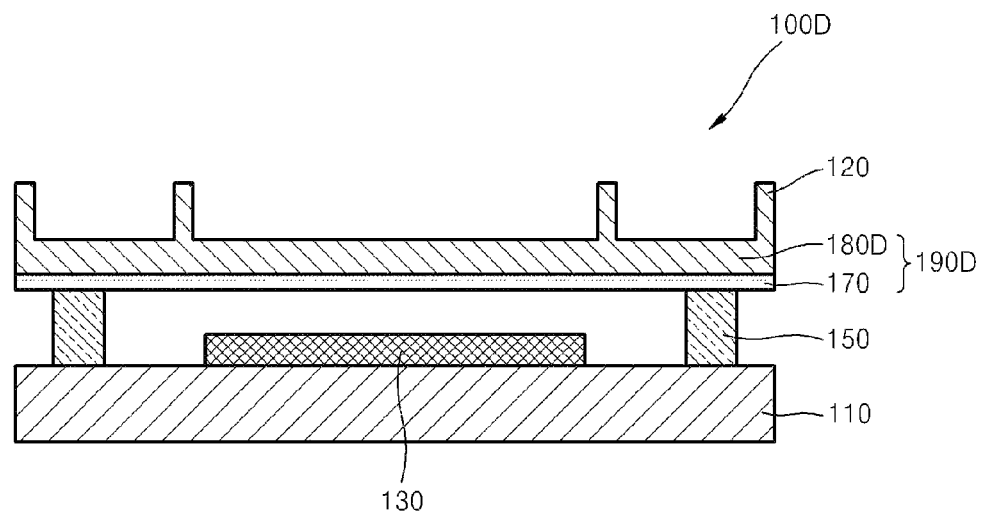
FIG. 22 is a cross-sectional view illustrating a display apparatus according to another embodiment of the present invention.
Figure 23:
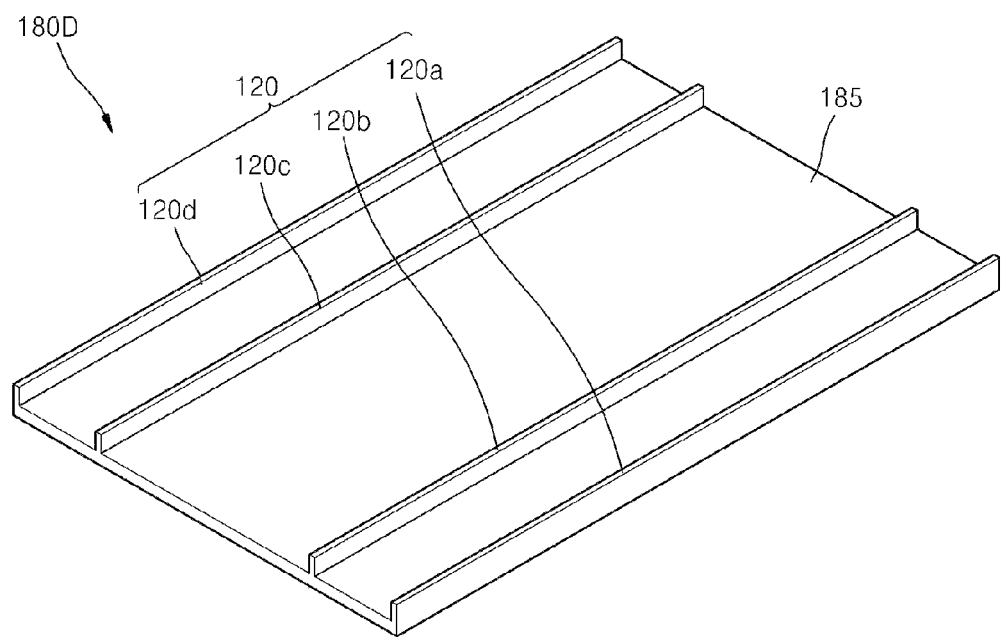
FIGS. 23 and 24 are perspective views illustrating a complex member of FIG. 22.
Figure 24:
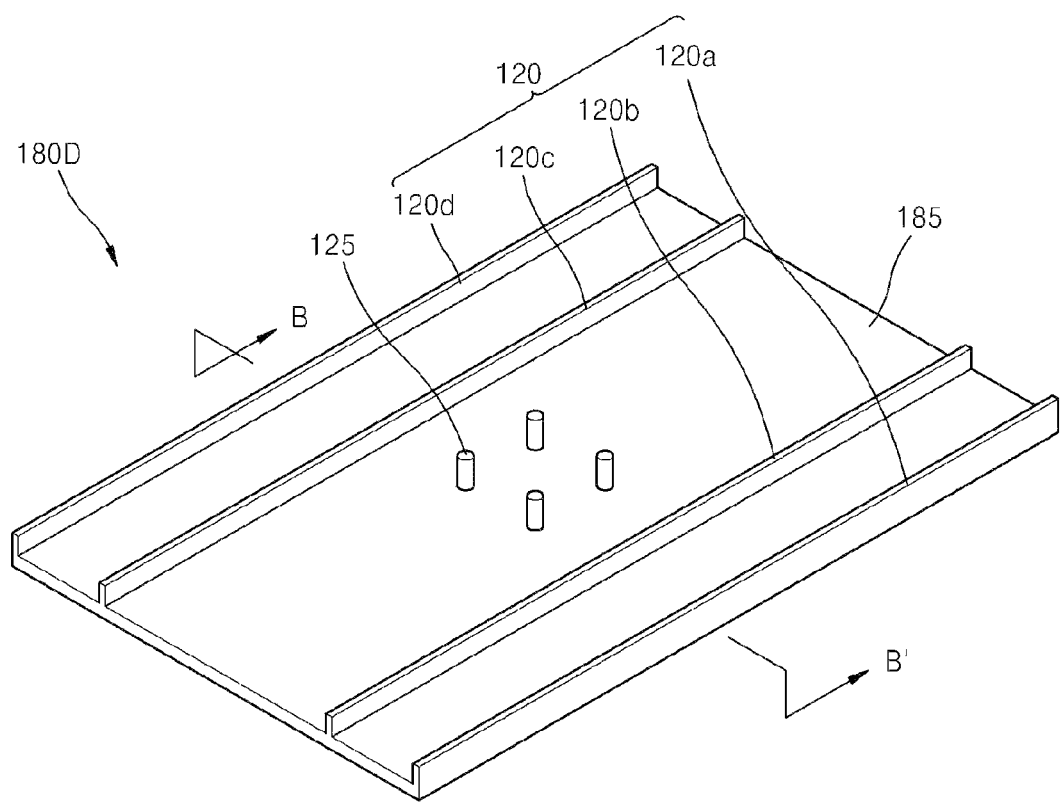
Figure 24:
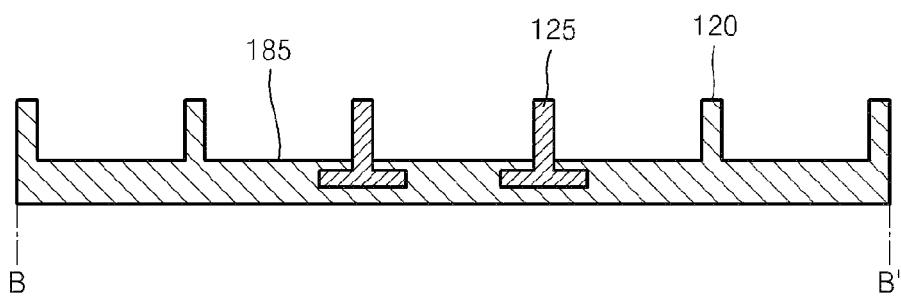

FIG. 22 is a cross-sectional view illustrating a display apparatus 100D according to another embodiment of the present invention. FIGS. 23 and 24 are perspective views illustrating various shapes of a complex member 180D of FIG. 22. Referring to FIG. 22, the display apparatus 100D includes a substrate 110, a display unit 130, an encapsulation unit 190D, and a sealing unit 150. The display apparatus 100D of FIG. 22 is generally the same as the display apparatus 100A of FIG. 1 except that a shape of an encapsulation unit 190D is different from a shape of the encapsulation unit 190A of the display apparatus 100A of FIG. 1. Thus, descriptions of repeated components will be omitted below.

The encapsulation unit 190D is disposed so as to face the display unit 130. The encapsulation unit 190D includes a metal layer 170 and the complex member 180D. The complex member 180D is formed on the metal layer 170. That is, the complex member 180D is disposed farther away from the display unit 130 than the metal layer 170 is. The complex member 180D includes a resin matrix and a plurality of carbon fibers, as illustrated in FIGS. 2 and 3.

The complex member 180D is flat, and a rib 120 protrudes in a form of a wallboard along a lengthwise direction from an upper surface of the complex member 180D. The rib 120 includes ribs 120a and 120d at two opposing edges of the rib 120 and extending along the lengthwise direction of the complex member 180D. Ribs 120b and 120c are formed interior to the ribs 120a and 120d on the complex member 180D. The ribs 120b and 120c are parallel to the ribs 120a and 120d. The rib 120 is formed as a single body with the complex member 180D and is extended therefrom. The rib 120 increases a surface moment of inertia of a cross-section of the complex member 180D in order to reduce drooping or twist distortion.

According to another aspect of the present invention, the complex member 180D is formed using a pultrusion method, and thus may be manufactured at reduced cost compared to a manufacturing method which uses the above-described mold. However, aspects of the present invention are not limited to the above, and the complex member 180D may be formed using other suitable methods.

As shown in FIG. 24, protrusions 125 are formed on a portion of the upper surface of the complex member 180D. The protrusions 125 are a connection member that connects an external device (not shown), such as a PCB, to the display apparatus 100D. For example, the protrusions 125 may have a bolt shape having a threaded outer surface. The protrusions 125 are each formed as a single unit with the complex member 180D of the encapsulation unit 190D and are each formed as a single unit with an uppermost layer of the complex member 180B. Positions or a number of the protrusions 125 are determined according to a type of the external devices to be connected to the display device 100D. Alternatively, a separate protrusion 125, for example, a bolt-shaped connection member, may be inserted into a predetermined position of the complex member 180D before the complex member 180D is crystallized, and then be fixed by hardening the complex member 180D.

Although not shown in FIG. 24, the complex member 180D may include an extension portion that is extended from an edge of the complex member 180D along the substrate 110 in a vertical direction. The extension portion protects the substrate 110 as illustrated in FIGS. 17 through 21. The extension portion is formed as a single unit with the complex member 180D. The extension portion is formed to surround an edge of the substrate 110 to prevent the edge of the substrate 110 from colliding with other objects. Accordingly, the encapsulation unit 190C obtains not only stably increased rigidity but also a durable structure with respect to handling or dynamic impact.

A thickness of a slim, large-screen TV is very thin compared to the size thereof, and thus bending may be problematic for the TV. According to the present invention, the display apparatus includes an encapsulation unit including a thin and light-weight complex member and a metal layer formed as a single unit. A reinforcement member, formed on an upper surface of the complex member, increases a surface moment of inertia of the complex member. Thus, rigidity of the encapsulation unit is increased. The reinforcement member may be convex portions formed on the base unit of the complex member as a single unit with the complex member or at least one rib formed on the upper surface of the complex member.

According to aspects of the present invention, the complex member has a three dimensional shape and thus instrumental rigidity of the display apparatus may be increased. In other words, bending can be prevented, and rigidity and drop reliability may be increased. When the instrumental rigidity is increased, the display apparatus does not have to include a bezel for maintaining rigidity or an adhesive tape for adhering the bezel to the encapsulation unit. Also, according to aspects of the present invention, the convex portions are formed on the complex member so as to form a three-dimensional shape and form a concave portion in an inner portion of the complex member. Accordingly, a material such as a getter may be easily inserted between the encapsulation unit and a lower substrate.

In addition, the edges of the complex member protrude toward the lower substrate, thereby stably increasing rigidity and protecting the edges of the lower substrate. Also, by forming a protrusion as a single unit with the complex member, additional components or connection portions connecting to the external device such as a PCB may be eliminated. According to the display apparatus, the encapsulation unit is formed to have various shapes without increasing a thickness of the encapsulation unit to thereby increase a surface moment of inertia. Accordingly, a light-weight and slim display apparatus with increased rigidity can be manufactured at low cost.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A display apparatus, comprising:
   a display unit disposed on a substrate; and
   an encapsulation unit facing the display unit, the encapsulation unit comprising:
   a metal layer; and
   a complex member including a base unit and a convex portion that protrudes upward from the base unit, the complex member comprising:
   a resin matrix; and
   carbon fibers,
   the metal layer disposed nearer to the substrate than the complex member.

2. The display apparatus of claim 1, further comprising a sealing unit disposed between the substrate and the encapsulation unit and spaced apart from the display unit, wherein the sealing unit bonds the substrate and the encapsulation unit to the sealing unit.

3. The display apparatus of claim 1, wherein the convex portion extends from the base unit in a direction away from the substrate, and wherein the convex portion has a shape of a square plate.

4. The display apparatus of claim 1, wherein the convex portion has a shape of a square ring.

5. The display apparatus of claim 1, wherein the convex portion comprises:
   a first convex portion extending from the base unit in a direction away from the substrate and having a shape of a square plate; and
   a second convex portion having a shape of an oval ring protruding upward from the first convex portion.

6. The display apparatus of claim 1, wherein the convex portion comprises:
   a first convex portion extending from the base unit in a direction away from the substrate and having a shape of a square plate; and
   a second convex portion protruding upward from the first convex portion, the second convex portion having an X-shape.

7. The display apparatus of claim 1, wherein the convex portion comprises:
   a first convex portion extending from the base unit in a direction away from the substrate and having a shape of a square plate; and
   a second convex portion protruding upward from the first convex portion and having a stripe shape.

8. The display apparatus of claim 1, wherein the convex portion further comprises a protrusion protruding from an upper surface.

9. The display apparatus of claim 1, wherein the complex member further comprises an extension portion extending from an edge of the encapsulation unit and surrounding an edge of the substrate.

10. The display apparatus of claim 1, wherein the carbon fibers comprise:
    first carbon fibers arranged in a first direction; and
    second carbon fibers arranged in a second direction perpendicular to the first direction.

11. The display apparatus of claim 1, wherein the carbon fibers are woven by being arranged in a horizontal direction and a vertical direction.

12. The display apparatus of claim 1, wherein the complex member is formed of layers each including the resin matrix and the carbon fibers.

13. The display apparatus of claim 12, wherein some of the carbon fibers are arranged in at least one of the layers in a first direction, and others of the carbon fibers are arranged in another layer of the layers in a second direction, and wherein the first direction and the second direction cross each other.

14. A display apparatus, comprising:
    a display unit disposed on a substrate; and
    an encapsulation unit facing the display unit, the encapsulation unit comprising:
    a metal layer;
    a complex member, the complex member comprising:
    a resin matrix; and
    carbon fibers; and at least one rib formed on an upper surface of the complex member, the metal layer disposed nearer to the substrate than the complex member.

15. The display apparatus of claim 14, further comprising a sealing unit disposed between the substrate and the encapsulation unit and spaced apart from the display unit, wherein the sealing unit bonds the substrate and the encapsulation unit to the sealing unit.

16. The display apparatus of claim 14, wherein the rib extends in a lengthwise direction of the complex member.

17. The display apparatus of claim 14, wherein the complex member comprises a protrusion protruding from an upper surface.

18. The display apparatus of claim 14, wherein the complex member comprises an extension portion extending from an edge of the encapsulation unit to surround an edge of the substrate.

19. The display apparatus of claim 14, wherein the carbon fibers comprise:

first carbon fibers arranged in a first direction; and
second carbon fibers arranged in a second direction perpendicular to the first direction.

20. The display apparatus of claim 14, wherein the carbon fibers are woven by being arranged in a horizontal direction and a vertical direction.

21. The display apparatus of claim 14, wherein the complex member is formed of layers, each of the layers including the resin matrix and the carbon fibers.

22. The display apparatus of claim 21, wherein some of the carbon fibers disposed in at least one of the layers are arranged in a first direction, and others of the carbon fibers disposed in another layer of the layers are arranged in a second direction, and wherein the first direction and the second direction cross each other.

23. The display apparatus of claim 22, wherein the first direction and the second direction cross each other at a right angle.

24. A display apparatus, comprising:
a display unit disposed on a substrate; and
an encapsulation unit facing the display unit, the encapsulation unit comprising:
a metal layer;
a complex member, the complex member comprising:
a resin matrix; and
carbon fibers; and
a reinforcement member formed on an upper surface of the complex member,
the metal layer disposed nearer to the substrate than the complex member.

25. The display apparatus of claim 24, further comprising a sealing unit disposed between the substrate and the encapsulation unit and spaced apart from the display unit, wherein the sealing unit bonds the substrate and the encapsulation unit to the sealing unit.

26. The display apparatus of claim 24, wherein the reinforcement member is a convex portion protruding upwards from a base unit of the complex member, and wherein the reinforcement member is formed as a single unit with the complex member.

27. The display apparatus of claim 24, wherein the reinforcement member is at least one rib formed on an upper surface of the complex member.

28. The display apparatus of claim 24, wherein the sealing unit comprises an epoxy resin.

29. The display apparatus of claim 24, wherein the carbon fibers comprise:

first carbon fibers arranged in a first direction; and
second carbon fibers arranged in a second direction perpendicular to the first direction.

30. The display apparatus of claim 24, wherein the carbon fibers are woven by being arranged in a horizontal direction and a vertical direction.

31. The display apparatus of claim 24, wherein a thermal expansion rate of the complex member is smaller than or similar to a thermal expansion rate of the substrate.

32. The display apparatus of claim 14, wherein a thermal expansion rate of the complex member is smaller than or similar to a thermal expansion rate of the substrate.

33. The display apparatus of claim 1, wherein a thermal expansion rate of the complex member is smaller than or similar to a thermal expansion rate of the substrate.

34. The display apparatus of claim 1, wherein a thickness of the complex member is thicker than a thickness of the metal layer.

* * * * *